(12) United States Patent
Yamazaki

(10) Patent No.: US 7,015,141 B2
(45) Date of Patent: Mar. 21, 2006

(54) SEMICONDUCTOR DEVICE AND MANUFACTURING METHOD THEREOF

(75) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/852,258

(22) Filed: May 25, 2004

(65) Prior Publication Data

US 2004/0214439 A1    Oct. 28, 2004

Related U.S. Application Data

(62) Division of application No. 10/329,405, filed on Dec. 27, 2002, now Pat. No. 6,753,257, which is a division of application No. 09/559,185, filed on Apr. 27, 2000, now Pat. No. 6,534,826.

(30) Foreign Application Priority Data

Apr. 30, 1999  (JP)  ............................. 11-124924
Jul. 22, 1999  (JP)  ............................. 11-206961

(51) Int. Cl.
   *H01L 21/302*  (2006.01)
   *H01L 21/461*  (2006.01)
(52) U.S. Cl. .................. 438/689; 438/714; 438/738
(58) Field of Classification Search ............... 438/689, 438/706, 712, 714, 720, 733, 735, 738–740
See application file for complete search history.

(56) References Cited

U.S. PATENT DOCUMENTS

| | | | |
|---|---|---|---|
| 5,323,042 A | 6/1994 | Matsumoto | |
| 5,508,209 A | 4/1996 | Zhang et al. | |
| 5,594,569 A | 1/1997 | Konuma et al. | |
| 5,623,157 A | 4/1997 | Miyazaki et al. | |
| 5,643,826 A | 7/1997 | Ohtani et al. | |
| 5,804,878 A | 9/1998 | Miyazaki et al. | |
| 5,821,622 A * | 10/1998 | Tsuji et al. | ................. 257/763 |
| 5,923,962 A | 7/1999 | Ohtani et al. | |
| 5,962,872 A | 10/1999 | Zhang et al. | |
| 6,008,132 A | 12/1999 | Tabara | |
| 6,022,805 A | 2/2000 | Sumi | |

(Continued)

FOREIGN PATENT DOCUMENTS

JP   7-130652   5/1995

(Continued)

OTHER PUBLICATIONS

M. Hatano, H. Akimoto, T. Sakai, IEDM 97 Technical Digest, pp. 523-526, 1997.

(Continued)

*Primary Examiner*—Phuc T. Dang
(74) *Attorney, Agent, or Firm*—Eric J. Robinson; Robinson Intellectual Property Law Office, P.C.

(57) ABSTRACT

A semiconductor device having high operating performance and reliability, and a manufacturing method thereof are provided.

An LDD region 207 provided in an n-channel TFT 302 forming a driving circuit enhances the tolerance for hot carrier injection. LDD regions 217–220 provided in an n-channel TFT (pixel TFT) 304 forming a pixel portion greatly contribute to the decrease in the OFF current value. Here, the LDD region of the n-channel TFT of the driving circuit is formed such that the concentration of the n-type impurity element becomes higher as the distance from an adjoining drain region decreases.

54 Claims, 19 Drawing Sheets

U.S. PATENT DOCUMENTS

| | | | |
|---|---|---|---|
| 6,030,667 A | 2/2000 | Nakagawa et al. | |
| 6,031,249 A | 2/2000 | Yamazaki et al. | |
| 6,031,290 A | 2/2000 | Miyazaki et al. | |
| 6,066,518 A | 5/2000 | Yamazaki | |
| 6,088,070 A | 7/2000 | Ohtani et al. | |
| 6,114,182 A | 9/2000 | Tabara | |
| 6,147,003 A | 11/2000 | Tabara et al. | |
| 6,147,667 A | 11/2000 | Yamazaki et al. | |
| 6,153,445 A | 11/2000 | Yamazaki et al. | |
| 6,159,811 A * | 12/2000 | Shin et al. | 438/303 |
| 6,165,824 A | 12/2000 | Takano et al. | |
| 6,166,414 A | 12/2000 | Miyazaki et al. | |
| 6,198,133 B1 | 3/2001 | Yamazaki et al. | |
| 6,255,705 B1 | 7/2001 | Zhang et al. | |
| 6,259,120 B1 | 7/2001 | Zhang et al. | |
| 6,259,138 B1 | 7/2001 | Ohtani et al. | |
| 6,265,327 B1 * | 7/2001 | Kobayashi et al. | 438/776 |
| 6,313,481 B1 | 11/2001 | Ohtani et al. | |
| 6,365,917 B1 | 4/2002 | Yamazaki | |
| 6,399,988 B1 | 6/2002 | Yamazaki | |
| 6,531,713 B1 | 3/2003 | Yamazaki | |
| 6,534,826 B1 | 3/2003 | Yamazaki | |
| 6,541,294 B1 | 4/2003 | Yamazaki et al. | |
| 6,646,287 B1 | 11/2003 | Ono et al. | |
| 6,664,145 B1 | 12/2003 | Yamazaki et al. | |
| 6,897,526 B1 * | 5/2005 | Miyanaga et al. | 257/345 |

FOREIGN PATENT DOCUMENTS

| | | |
|---|---|---|
| JP | 09-293600 | 11/1997 |
| JP | 10-247735 | 9/1998 |
| JP | 10-270363 | 10/1998 |

OTHER PUBLICATIONS

1998 SID, "Characteristics and Driving Scheme of Polymer-Stabilized Monostable FLCD Exhibiting Fast Response Time and High Contrast Ratio with Gray-Scale Capability," by H. Furue et al., pp. 782-785.

1997 SID Digest, 841, "A Full-Color Thresholdless Antiferroelectric LCD Exhibiting Wide Viewing Angle With Fast Response Time" by T. Yoshida et al., pp. 841-844.

1996, J. Mater. Chem. 6(4), "Thresholdless Antiferroelectricity in liquid crystals and its application to displays," by S. Inui et al., pp. 671-673.

Specification and Drawings for U.S. Appl. No. 09/433,705, filed Nov. 4, 1999, "Method of Fabricating Semiconductor Device," Shunpei Yamazaki.

Inventors: Shunpei Yamazaki et al., "Semiconductor Device and Method for Fabricating the Same", Filing Date: Apr. 7, 2000, Specifications, Drawings and Pending Claims for U.S. Appl. No. 09/544,801.

* cited by examiner

303: n-channel TFT

SEMICONDUCTOR DEVICE AND MANUFACTURING METHOD THEREOF

This application is a Division of 10/329,405 filed Dec. 27, 2002 (U.S. Pat. No. 6,753,257) which is a Division of 09/559,185 filed Apr. 27, 2000 (U.S. Pat. No. 6,534,826).

BACKGROUND OF THE INVENTION

1. Field of the Invention

This invention relates to a semiconductor device having a circuit or an element comprising thin film transistors (hereinafter referred to as "TFTs") on a substrate having an insulating surface, and to a manufacturing method thereof. More specifically, the present invention relates to electro-optical devices (called also "electronic equipments") typified by a liquid crystal display device including a pixel section (pixel matrix circuit) and driver circuits disposed around the pixel section and formed on the same substrate and, and electrical devices (called also "electronic appliances") having the electro-optical device mounted thereto. Note that, throughout this specification, the semiconductor device indicates general devices that can function by using semiconductor characteristics, and that electro-optical device, semiconductor circuit, and electronic equipment are all categorized as semiconductor devices.

2. Description of the Related Art

Development of a semiconductor device having a large area integrated circuit, that comprises TFTs formed on a substrate having an insulation surface, has been made progressively. An active matrix type liquid crystal display device, an EL display device and a close adhesion type image sensor are typical of such semiconductor devices. Particularly because TFTs using a polycrystalline silicon film (typically, a poly-Si film) as an active layer (the TFT will be hereinafter referred to as "poly-silicon TFT") have high electric field mobility, they can form a variety of functional circuits.

In the active matrix type liquid crystal display device, for example, an integrated circuit that includes a pixel section for displaying images for each functional block, a shift register circuit, a level shifter circuit, a buffer circuit each being based on a CMOS circuit and a sampling circuit, and so forth, is formed on one substrate. In the case of the close adhesion type image sensor, a driver circuit such as a sample-and-hold circuit, a shift register circuit, a multiplexer circuit, and so forth that drive the pixel section, are formed by using the TFTs.

These driver circuits (which are also called "peripheral driver circuits") do not always have the same operating condition. Therefore, the characteristics required for the TFTs are naturally different to certain extent. The pixel section comprises a pixel TFT functioning as a switching device and an auxiliary storage capacitor, and a voltage is applied to a liquid crystal to drive it. Here, it is necessary to drive the liquid crystal by alternating current, and a system called "frame inversion driving" is widely applied. Therefore, one of the required characteristics of the TFT is that an OFF current value (a drain current value flowing through the TFT when it is in the OFF operation) must be sufficiently lowered. In a buffer circuit on the other hand, because a high driving voltage is applied, the TFT must have a high withstand voltage such that it does not undergo breakdown even when a high voltage is applied. In order to improve the current driving capacity, it is necessary to sufficiently secure the ON current value (the drain current value flowing through the TFT when it is in the ON operation).

However, the poly-silicon TFT involves the problem that its OFF current is likely to become high. Degradation such as the drop of the ON current value is observed in the poly-silicon TFT in the same way as in MOS transistors used for ICs, or the like. It is believed that the main cause is hot carrier injection, and the hot carriers generated by a high electric field in the proximity of the drain presumably invite this degradation.

An LDD (lightly doped drain) structure is known as a structure of the TFT for lowering the OFF current value. This structure forms an impurity region having a low concentration between a channel forming region and a source or drain region to which an impurity is doped in a high concentration. The low concentration impurity region is called the "LDD region".

A so-called "GOLD (gate-drain overlapped LDD) structure" is also known as a structure for preventing deterioration of the ON current value by hot carrier injection. Since the LDD region is so arranged as to overlap with a gate wiring through a gate insulation film in this structure, this structure is effective for preventing hot carrier injection in the proximity of the drain and for improving reliability. For example, Mutsuko Hatano, Hajime Akimoto and Takeshi Sakai, "IEDM97 Technical Digest", pp. 523–526, 1997, discloses a GOLD structure using side walls formed from silicon. It has been confirmed that this structure provides by far higher reliability than the TFTs having other structures.

In a pixel section of an active matrix type liquid crystal display device, a TFT is disposed for each of dozens to millions of pixels and a pixel electrode is disposed for each TFT. An opposing electrode is provided on an opposing substrate side beyond a liquid crystal, and forms a kind of capacitors using the liquid crystal as a dielectric. The voltage to be applied to each pixel is controlled by the switching function of the TFT. As the charge to this capacitor is controlled, the liquid crystal is driven, and an image is displayed by controlling the quantity of transmitting rays of light.

However, the accumulated capacity of this capacitor decreases gradually due to a leakage current resulting from the OFF current, or the like. Consequently, the quantity of transmitting rays of light changes, thereby lowering the contrast of image display. Therefore, it has been customary to dispose a capacitance wiring, and to arrange another capacitor (called a "storage capacitor") in parallel with the capacitor using the liquid crystal as the dielectric in order to supplement the capacitance lost by the capacitor using the liquid crystal as the dielectric.

Nonetheless, the required characteristics of the pixel TFT of the pixel section are not always the same as the required characteristics of the TFT (hereinafter called the "driving TFT") of a driving circuit such as the shift register circuit and the buffer circuit. For example, a large reverse bias voltage (a negative voltage in n-channel TFT) is applied to the gate wiring in the pixel TFT, but the TFT of the driver circuit is not fundamentally driven by the application of the reverse bias voltage. The operation speed of the former need not be as fast as that of the latter.

The GOLD structure has a high effect for preventing the degradation of the ON current value, it is true, but is not free from the problem that the OFF current value becomes greater than the ordinary LDD structures. Therefore, the GOLD structure cannot be said as an entirely preferable structure for the pixel TFT, in particular. On the contrary, the ordinary LDD structures have a high effect for restricting the OFF current value, but is not resistant to hot carrier injection, as is well known in the art.

For these reasons, it is not always preferred to constitute all the TFTs by the same structure in the semiconductor devices having a plurality of integrated circuits such as the active matrix type liquid crystal display device.

SUMMARY OF THE INVENTION

The present invention is a technique for solving the above stated subjects, and an object of the present invention is to enhance the operation performance and the reliability of a semiconductor device by optimizing the TFT structure disposed in a circuit or an element of the semiconductor device, correspondent to its function. Further, the present invention provides a manufacturing method for materializing such semiconductor device.

In order to solve the above stated problems, the present invention has a goal for example in allotting an optimized structure of TFT according to the function required by a circuit or an element formed in a semiconductor device such as a liquid crystal display device. Namely TFTs of different structures exist on a same substrate.

In concrete, it is preferable that an element which imposes great importance on sufficient reduction of OFF current value (switching element etc.) has a TFT structure which places more importance on reduction of OFF current value than operation speed. On the other hand, a TFT structure which places greater importance on increase in operation speed and on prevention of degradation due to hot carrier, a noticeable problem which arises at the same time, is preferred in an element which has its major object in high speed operation (driver circuit element etc.)

The present invention enables improvement of the operation performance and the reliability of a semiconductor device by properly using the above stated TFTs over the same substrate.

A measure is further taken in the structure of the LDD region of an n-channel TFT for preventing the degradation due to hot carrier injection. In other words, the present invention has a characteristic in disposing a concentration gradation in the LDD region between the channel forming region and the drain region so that the concentration of n-type impurity element becomes gradually higher as getting closer to the drain region. This structure calculate upon higher effect of relieving the electric field.

Further in case of disposing the above stated concentration gradation, the concentration of n-type impurity element included in the proximity of the boundary between a LDD region and the channel forming region of an n-channel TFT becomes lower than the concentration included in the proximity of the boundary between the LDD region and the drain region. A higher effect of relieving electric field is obtained in the similar way.

DETAILED DESCRIPTION OF THE PREFERRED EMBODIMENTS

An embodiment mode of the present invention is described in detail according to the embodiments shown below.

[Embodiment 1]

An embodiment according to the present invention is described by using FIGS. 1A to 4B. A method for fabricating at the same time, TFTs for a pixel section and a driver circuit provided in its peripheral, is described here. Note that a CMOS circuit which is a basic circuit for a shift register and buffer etc., and an n-channel TFT forming a sampling circuit are shown for the driver circuit for the simplicity of explanation.

Figure 1A:
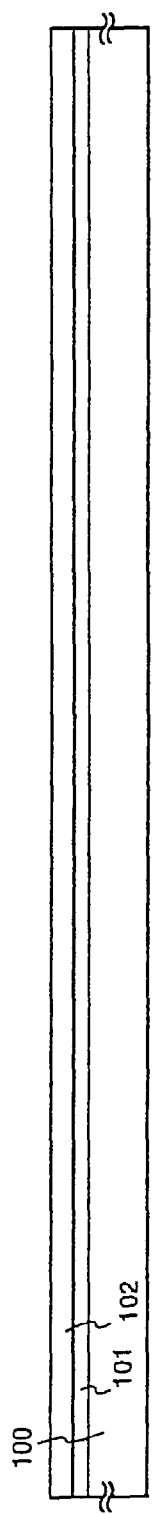
FIG. 1A–1E illustrates manufacturing steps of a pixel portion and a driver circuit.

In FIG. 1A, it is preferable to use a glass substrate or a quartz substrate for substrate 100. Other than those, a silicon substrate, a metal substrate or a stainless steel substrate having an insulating film formed on the surface thereof may be used. If heat resistivity permits, it is also possible to use a plastic substrate.

A base film 101 formed from an insulating film comprising silicon ("an insulating film comprising silicon" generically represents a silicon oxide film, a silicon nitride film and a silicon oxynitride film in the present Specification) is formed by plasma CVD or sputtering to a thickness of 100 to 400 nm on the surface of the substrate 100 on which the TFTs are to be fabricated.

Through the present Specification, silicon oxynitride film is an insulating film represented by SiOxNy and denotes an insulating film which comprises silicon, oxygen and nitrogen at a prescribed proportion. In the present Embodiment a lamination of a silicon oxynitride film of 100 nm thickness which contains nitrogen at 20 to 50 atomic % (typically 20 to 30 atomic %) and a silicon oxynitride film of 200 nm thickness which contains nitrogen at 1 to 20 atomic % (typically 5 to 10 atomic %) is used for the base film 101. Note that the thickness need not be limited to these values. The proportion (atomic % proportion) of nitrogen and oxygen contained in the silicon oxynitride film may be 3:1 to 1:3 (typically 1:1). Further, the silicon oxynitride film may be fabricated from $SiH_4$, $N_2O$ and $NH_3$ as raw material gases.

Note that base film 101 is disposed to prevent impurity contamination from the substrate, and it is not necessarily formed in case of using a quartz substrate.

A semiconductor film containing amorphous structure (amorphous silicon film in the present embodiment (not shown)) is formed on the base film 101 at a thickness of 30 to 120 nm (preferably 50 to 70 nm) by a known film deposition method. As a semiconductor film containing amorphous structure, there are amorphous semiconductor film and microcrystalline semiconductor film. Further, a compound semiconductor film containing amorphous structure such as amorphous silicon germanium film etc. may also be included. When the film was formed into the above stated thickness, the thickness of the active layer at the point of finally completing the TFT becomes 10 to 100 nm (preferably 30 to 50 nm).

A semiconductor film containing crystalline structure (crystalline silicon film in embodiment 1) 102 is formed according to a technique disclosed in the Japanese Patent Application Laid-Open No. Hei 7-130652 (corresponding to U.S. Pat. No. 5,643,826). The technique described in the gazette is a crystallization means that uses a catalytic element for promoting crystallization (one or plural of element selected from nickel, cobalt, germanium, tin, lead, palladium, iron and copper; typically nickel) in crystallizing the amorphous silicon film.

More concretely, heat-treatment is conducted under the condition where the catalytic element(s) is held on the surface of the amorphous silicon film to convert the amorphous silicon film to the crystalline silicon film. Although Embodiment 1 uses a technique described in the Embodiment 1 of the gazette, a technique described in Embodiment 2 may also be used. Though single crystal silicon film and polycrystalline silicon film are both included in crystalline silicon film, the crystalline silicon film formed in the present embodiment is a silicon film having crystal grain boundaries. (FIG. 1A)

Though it depends on hydrogen content in the amorphous silicon film, it is preferable to carry out dehydrogenating process by heating at 400 to 550° C. for some hours to reduce the contained hydrogen amount at 5 atom % or lower and conduct crystallization process. The amorphous silicon film may be fabricated by other deposition methods such as sputtering or vapor deposition, but it is preferable to sufficiently reduce impurity elements such as oxygen or nitrogen contained in the film.

Because the base film and the amorphous silicon film can be fabricated by the same deposition method, they may be successively formed. It becomes possible to prevent contamination of the surface by not exposing to the atmosphere after formation of the base film, so that scattering in the characteristics of the fabricated TFTs can be reduced.

Figure 1B:
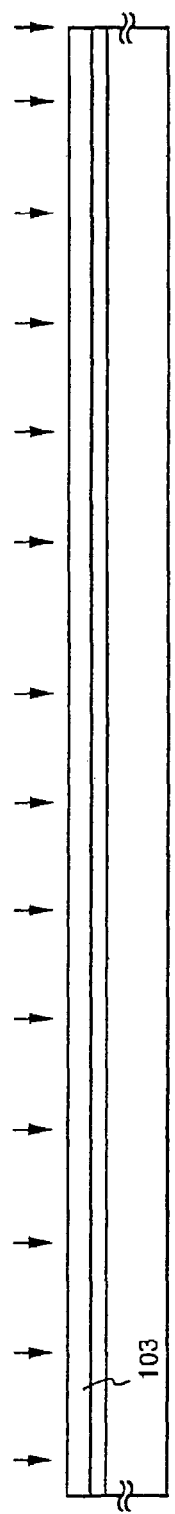

Next, a light generated from a laser light source (laser light) is irradiated onto the crystalline silicon film 102 (hereinafter referred to as laser anneal) and a crystalline silicon film 103 in which crystallinity is improved is formed. Though a pulse oscillation type or a continuous oscillation type excimer laser light is preferable for the laser light, a continuous oscillation type argon laser light may also be used as the laser light. The beam shape of the laser light may be linear, or it may be a rectangular shape. (FIG. 1B)

In place of laser light, a light generated from a lamp (lamp radiation) may be irradiated (hereinafter referred to as lamp annealing). As a lamp radiation, lamp radiation generated from for instance halogen lamp or infrared lamp can be used. Needless to say, they may be replaced by a furnace annealing using electric furnace (referred to as thermal annealing), and a combination of these may also be used.

In the embodiment 1, laser annealing process was carried out by forming pulse oscillation type excimer laser light into a linear shape. The laser annealing conditions are: XeCl gas is used as excitation gas, treatment temperature is set at room temperature, pulse oscillation frequency is set at 30 Hz, and laser energy density at 250 to 500 mJ/cm$^2$ (typically 350 to 400 mJ/cm$^2$).

Laser annealing process carried out at the above stated conditions has an effect of completely crystallizing the amorphous region remained after heat crystallization as well as reducing defects in the crystalline region already crystallized. Accordingly, the present process may be called a process for improving crystallinity of the semiconductor film, or a process for promoting crystallization of the semiconductor film.

Next, a protecting film 104 is formed on crystalline silicon film 103 for the later impurity doping process. Silicon oxynitride film or silicon oxide film at a thickness of 100 to 200 nm (preferably 130 to 170 nm) is used for the protecting film 104. This protecting film 104 has an effect of not exposing the crystalline silicon film directly to plasma, and to enable minute concentration control at impurity doping.

Then, a resist mask 105 is formed thereon, and impurity element imparting p-type (hereinafter referred to as p-type impurity element) is doped through protecting film 104. As a p-type impurity element, typically an element which belongs to Group 13 of periodic table, more specifically, boron or gallium can be used. This process (referred to as channel doping process) is a process for controlling threshold voltage of a TFT. Here, boron is doped by ion doping in which diborane ($B_2H_6$) is excited by plasma without mass separation. Needless to say, it is acceptable to use ion implantation in which mass separation is performed.

Figure 1C:
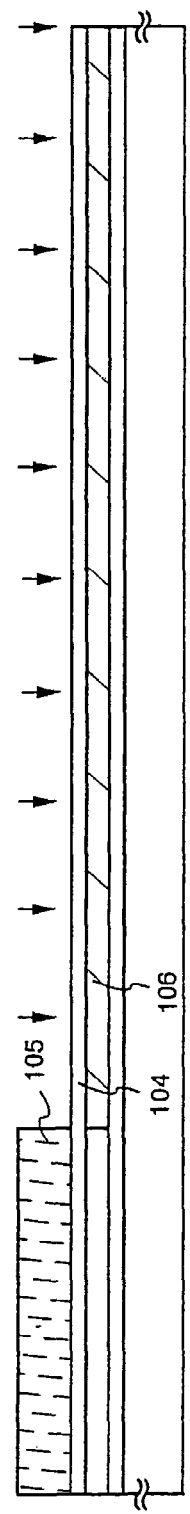

By this process, impurity region 106 including p-type impurity (boron in the present embodiment) at a concentration of $1\times10^{15}$ to $1\times10^{18}$ atoms/cm$^3$ (typically $5\times10^{16}$ to $5\times10^{17}$ atoms/cm$^3$) is formed. Note that through the specification, an impurity region containing p-type impurity region in the above stated concentration range is defined as a p-type impurity region (b) (provided, regions where impurity elements imparting n-type are intentionally doped are excluded). (FIG. 1C)

Note that though the p-type impurity element is added only to the regions that become n-channel TFTs, it may be added to the entire surface including regions that will become p-channel TFTs. Further, an element which belongs to Group 15 may be added only to the p-channel TFTs before or after adding p-type impurity element on the entire surface.

Figure 1D:
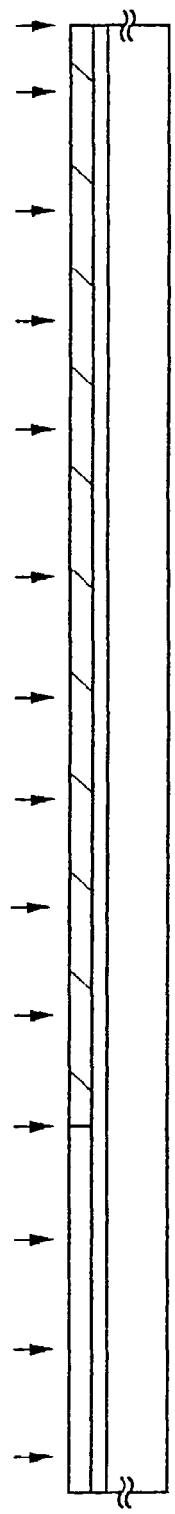

Next, protecting film 104 and resist mask 105 are removed, and irradiation process of laser light was conducted again. Here again excimer laser light of pulse oscillation type or continuous oscillation type is preferable, but argon laser light of continuous oscillation type may also be used. The beam shape of the laser light may be either of linear or rectangular shape. Provided, because activation of the doped impurity element is the object, it is preferable to irradiate with an energy at a level of not melting the crystalline silicon film. It is also possible to conduct laser annealing process with the protecting film 104 left thereon. (FIG. 1D)

In embodiment 1, laser annealing process was carried out by forming pulse oscillation type excimer laser light into a linear shape. The laser annealing conditions are: XeCl gas is used as excitation gas, treatment temperature is set at room temperature, pulse oscillation frequency is set at 30 Hz, and laser energy density at 100 to 300 mJ/cm$^2$ (typically 150 to 250 mJ/cm$^2$).

The light annealing process carried out on the above stated conditions has an effect of recrystallizing the semiconductor film that was made into amorphous in impurity element doping as well as activating the impurity element imparting n-type or p-type that was doped. It is preferable that the above stated conditions make atomic arrangement coordinated without melting the semiconductor film and at the same time activate the impurity elements.

The activation of the impurity element by this laser light may be performed by furnace annealing, or it may be performed by combination of these. In case of performing activation by furnace annealing, it may be performed at approximately 450 to 550° C. considering heat resistance of the substrate.

Figure 1E:
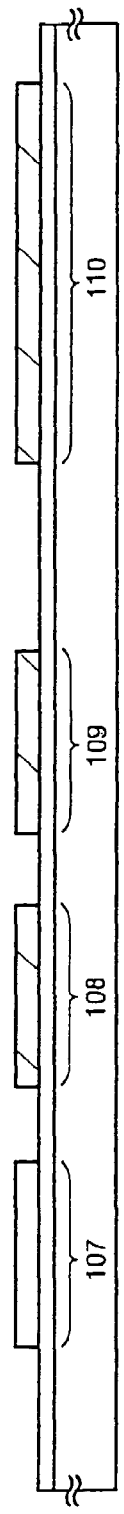

Next, unnecessary portions of the crystalline silicon film are removed to form island semiconductor layers (hereinafter referred to as active layers) 107 to 110. (FIG. 1E)

Next, gate insulating film 111 is formed to cover the active layers 107 to 110.

Gate insulating film 111 may be formed into a thickness of 10 to 200 nm, preferably into 50 to 150 nm. In the present embodiment, a silicon oxynitride film is formed into a thickness of 115 nm by plasma CVD with raw materials of N$_2$O and SiH$_4$.

Then, a conductive film 112 that will form gate electrode is formed. Note that though the conductive film 112 may be formed by a single layer, it is preferable to form laminated films of double layers, or triple layers as occasion demands.

Though any conductive film may be used for the conductive film 112, it is preferable to have a film that is easily formed into a tapered shape. Typically a metal film comprising an element selected from tantalum (Ta), chromium (Cr), tungsten (W) and silicon (Si) having conductivity, or a metal compound film composed of these element as its main component (typically tantalum nitride film or tungsten nitride film), or an alloy film including the above stated elements (typically Mo—W alloy, Mo—Ta alloy, tungsten silicide film) or a laminate film of these thin films may be used. In the present embodiment a lamination of a tantalum nitride film of 50 nm thickness and a tantalum film of 350 nm thickness is used.

The thickness of the conductive film 112 is 50–500 nm (preferably 200–400 nm, and more preferably 300–350 nm). This thickness is important since it influences the length of tapered portions of gate electrodes.

Figure 2A:
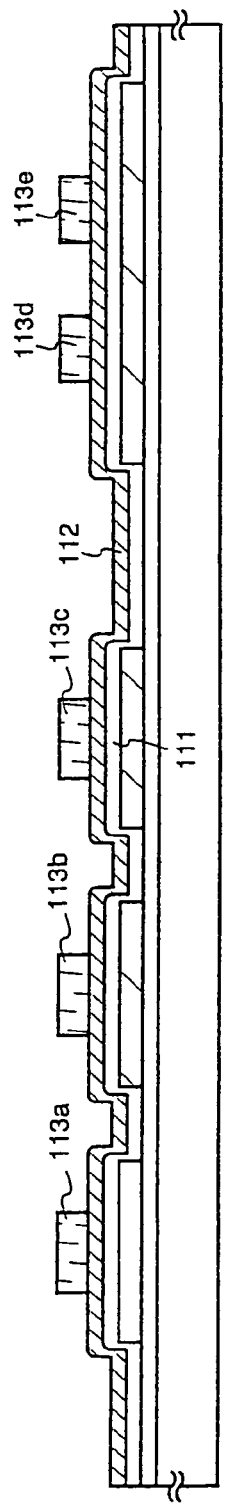
FIG. 2A–2D illustrates manufacturing steps of the pixel portion and the driver circuit.

Next, resist masks 113a–113e for forming gate electrodes are formed, which is illustrated in FIG. 2A.

Figure 2B:
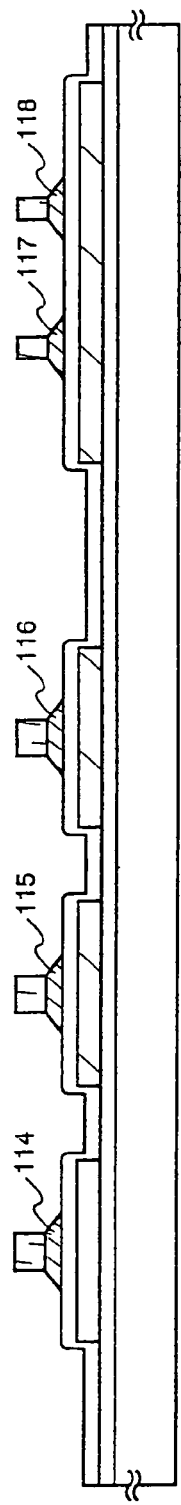

Then, the conductive film 112 is collectively etched to form gate electrodes 114–118 at the thickness of 400 nm. Here, the etching is carried out such that tapered portions are formed at end portions of the gate electrodes 114–118 (FIG. 2B).

Figure 6:
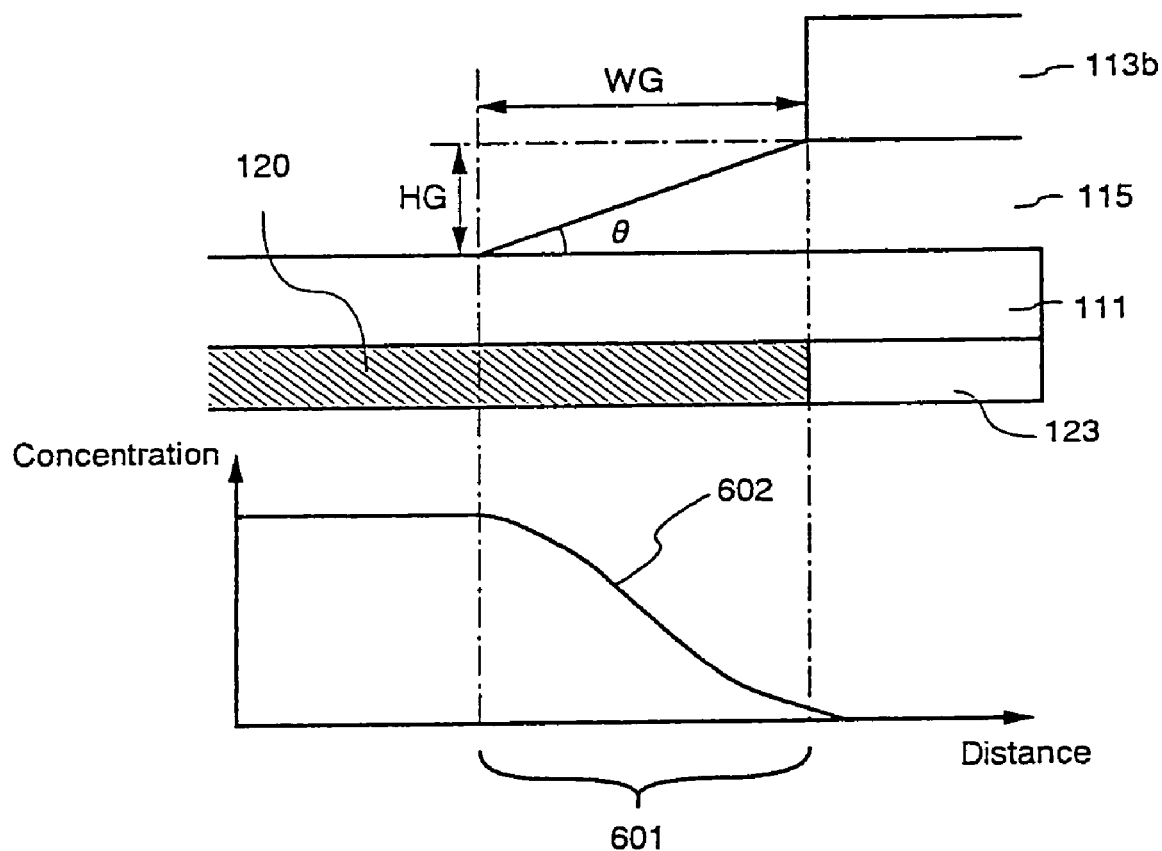
FIG. 6 illustrates the LDD structure of an n-channel TFT.

An angle θ of the tapered portions is the angle illustrated in FIG. 6. In the present invention, the etching conditions are set such that the angle θ is 3–40° (preferably 5–35°, more preferably 7–20°). The angle θ greatly influences, in a later step, the concentration gradient in LDD regions, which will be described in the following.

It is to be noted that the taper angle θ is expressed as Tan θ=HG/WG, wherein WG is the length of the tapered portions and HG is the thickness of the tapered portions.

Figure 2C:
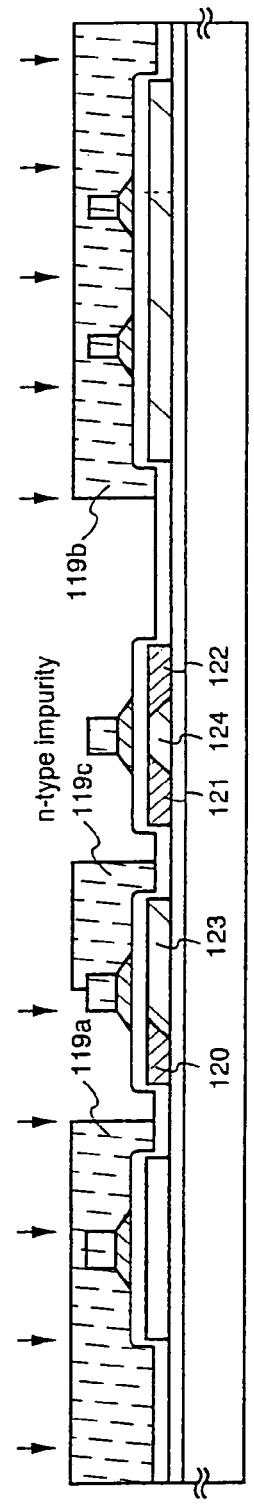

Then, with the resist masks 113a–113e used for forming the gate electrodes 114–118 remaining, resist masks 119a–119c are newly formed. Then, an impurity element for n-type (hereinafter referred to as an n-type impurity element) is added to form n-type impurity regions 120–122. It is to be noted that, as the n-type impurity element, typically an element which belongs to the Group 15, typically, phosphorus or arsenic can be used (FIG. 2C).

The lightly doped impurity regions 120–122 are impurity regions to, later, function as LDD regions in n-channel TFTs of a CMOS circuit and of a sampling circuit. It is to be noted that the n-type impurity element at the concentration of $2\times10^{16}$–$5\times10^{19}$ atoms/cm$^3$ (typically $5\times10^{17}$–$5\times10^{18}$ atoms/cm$^3$) is contained in the impurity regions formed here. Such impurity regions containing an n-type impurity element in the above-mentioned concentration range is defined herein as n-type impurity regions (b).

It is to be noted that phosphorus is added at the concentration of $1\times10^{18}$ atoms/cm$^3$ by ion doping phosphine (PH$_3$) which is plasma excited without mass separation. Of course, ion implantation with mass separation may also be used. In this process, phosphorus is added to the crystalline silicon film through the protective film 107.

According to the present invention, the n-type impurity regions (b) 120–122 are formed so as to overlap part of the gate electrodes 115 and 116 through the gate insulating film 111. More specifically, by increasing the acceleration voltage of the ion doping process (typically to 80–160 keV), the impurity element is added through the tapered portions of the gate electrodes.

This makes the concentration gradient of phosphorus contained in portions of the n-type impurity regions (b) 120–122 overlapping the gate electrodes 115 and 116 reflect the change in the film thickness of the tapered portions of the gate electrodes 115 and 116. More specifically, the concentration of phosphorus added to the n-type impurity regions (b) 120–122 in regions overlapping the tapered portions gradually increases as the distance from the p-type impurity regions (b) 123 and 124 increases.

This is because, depending on the film thickness of the tapered portions, the concentration of the added phosphorus in the depth direction varies. More specifically, when attention is paid to the depth of added phosphorus of an arbitrary concentration (for example, the concentration averaged in the depth direction), in the concentration distribution in the depth direction, the depth varies so as to go along the gradient of the tapered portions of the gate electrodes in the section direction in the semiconductor films.

Here, the result of simulation of adding phosphorus using an electrode having a tapered shape is described with reference to FIG. 16. Here, a semiconductor device simulator integrated package by ISE (Integrated System Engineering AG) was used.

Figure 16:
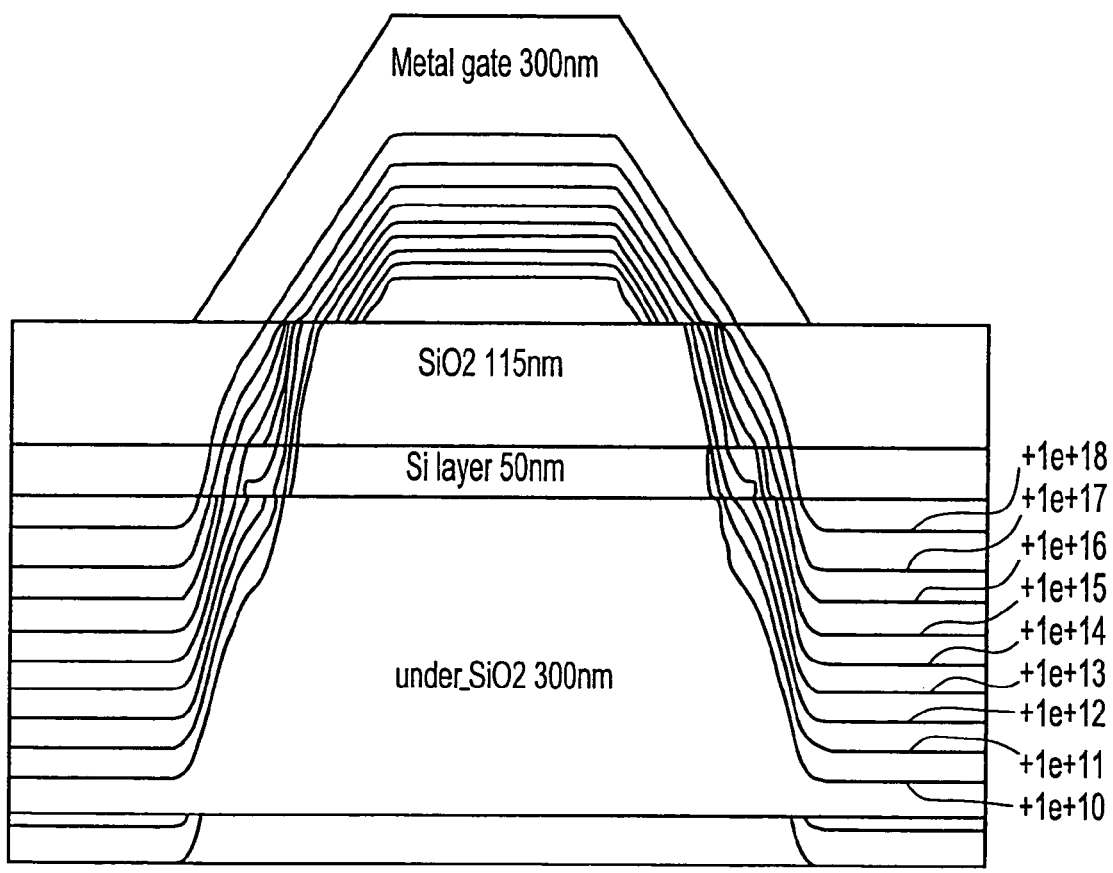
FIG. 16 illustrates the result of simulation of forming an LDD region.

FIG. 16 shows concentration distribution of phosphorus at an end portion of a gate electrode. Here, the calculation was made on the assumption that the film thickness of the gate electrode was 300 nm, the taper angle θ was 10.5°, the acceleration voltage was 110 keV, and the dose amount of phosphorus added by plasma doping (ion doping) was $1\times10^{15}$ ions/cm$^2$. It is to be noted that the thickness of the gate insulating film, that of the semiconductor film, and that of the base film (silicon oxide film) were assumed to be 115 nm, 50 nm, and 300 nm, respectively.

As is clear from FIG. 16, in the semiconductor film (denoted by Si Layer), with regard to a region immediately under the tapered portion of the gate electrode, the concentration of phosphorus varies along the channel length direction (the section direction). More specifically, a gradient is shown where the concentration of phosphorus becomes higher as the distance from a channel forming region increases (as the distance from a drain region decreases).

Although the acceleration voltage was 110 keV here, it is expected that, if the acceleration voltage becomes higher, the concentration of phosphorus becomes still higher inside the gate electrode. Further, it is expected that similar result will be obtained using ion implantation.

It is to be noted that, though the end portions of the n-type impurity regions (b) 120–122 are shown diagonal in FIG. 2A, this does not illustrate regions where phosphorus is added, but means that the concentration of phosphorus in the section direction varies along the shape of the tapered portions of the gate electrodes 115 and 116.

This point is described with reference to FIG. 6. FIG. 6 is an enlarged view of the n-type impurity region (b) 120 in FIG. 2C. As shown in FIG. 6, the n-type impurity region (b) 120 is formed also under a tapered portion 601. Here, the concentration of phosphorus in the tapered portion 601 increases as the distance from the p-type impurity region 123 increases as shown by a curve 602.

The increasing rate depends on the ion doping conditions and the change in the film thickness of the tapered portion 601. Further, the change in the film thickness of the tapered portion 601 depends on the taper angle θ and the film thickness of the gate electrode 115.

In this way, by tapering the end portions of the gate electrodes and by adding an impurity element through the tapered portions, impurity regions having gradually varying concentration of the impurity element can be formed in the semiconductor films existing under the tapered portions. In the present invention, such impurity regions are enterprisingly utilized as LDD regions.

Primarily, an LDD region is provided for alleviating sudden change in concentration between a channel forming region and a drain region. In that sense, it can be said that the above-described structure is the most preferable LDD region.

Figure 2D:
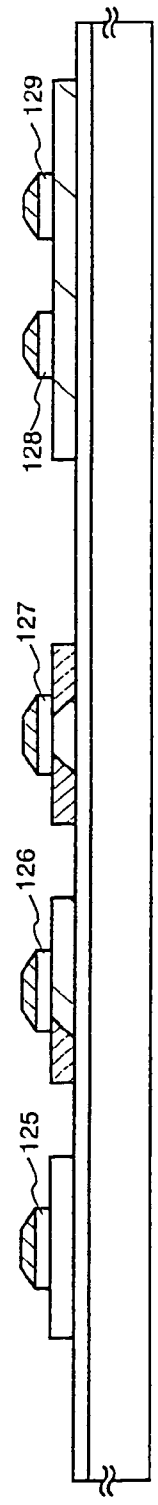

In this way, the n-type impurity regions 120–122 having therein a concentration gradient are formed. Then, the resist masks 119a–119c, and 113a–113e are removed, and the gate insulating film 111 is etched to be removed in a self-aligning manner with the gate electrodes 114–118 being as the mask. In this way, gate insulating films 125–129 which remain under the gate electrodes 114–118 are formed (FIG. 2D).

By exposing the active layers in this manner, acceleration voltage in performing next doping process of impurity elements can be kept low. Accordingly throughput is improved since the necessary dose amount is small. Needless to say, the impurity regions may also be formed by through doping without etching the gate insulating film.

Figure 3A:
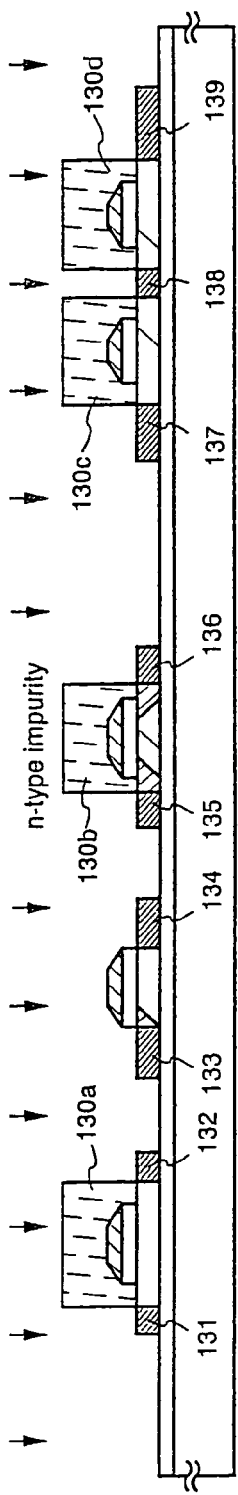
FIG. 3A–3D illustrates manufacturing steps of the pixel portion and the driver circuit.

Resist masks 130a to 130d are next formed to cover the gate electrodes and impurity regions 131 to 139 that contain phosphorus at a high concentration were formed by adding n-type impurity element (phosphorus in embodiment 1). Again ion doping (ion implantation is also acceptable) was conducted by utilizing phosphine ($PH_3$) and the phosphorus concentration in these regions are set at $1\times10^{20}$ to $1\times10^{21}$ atoms/cm$^3$ (specifically $2\times10^{20}$ to $5\times10^{21}$ atoms/cm$^3$). (FIG. 3A)

Note that in this Specification an impurity region containing n-type impurity element in the above stated concentration range is defined as n-type impurity region (a). Further, although phosphorus or boron, added in the preceding processes, are already contained in the impurity regions 131 to 139, influence of phosphorus or boron added in the preceding processes need not be considered since phosphorus is later added at a sufficiently high concentration. Therefore, it is acceptable to refer in this Specification, the impurity regions 131 to 139 to as n-type impurity region (a).

Figure 3B:
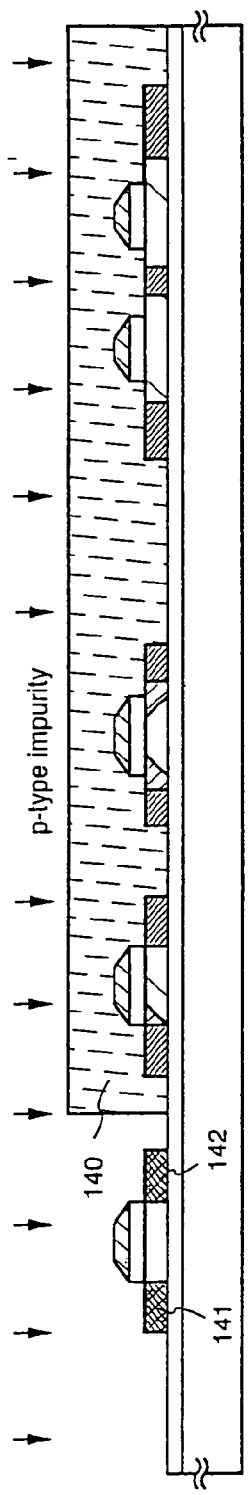

Resist masks 130a to 130d are then removed, and new resist mask 140 is formed. Then, p-type impurity element (boron in the present embodiment) is doped, and impurity regions 141 and 142 that include boron at a high concentration are formed. Here, boron is doped at a concentration of $3\times10^{20}$ to $3\times10^{21}$ atoms/cm$^3$ (typically $5\times10^{20}$ to $1\times10^{21}$ atoms/cm$^3$) by ion doping (ion implantation is also acceptable) using diborane ($B_2H_6$). In the present specification, an impurity region that includes p-type impurity region in the above stated concentration range is defined as p-type impurity region (a). (FIG. 3B)

Phosphorus is doped in a portion of impurity regions 141 and 142 (n-type impurity regions (a) 131 and 132 stated above) at a concentration of $1\times10^{20}$ to $1\times10^{21}$ atoms/cm$^3$. However boron is doped at a concentration higher by at least 3 times here. Therefore, already formed n-type impurity regions are totally inverted to p-type, and function as p-type impurity regions. Accordingly, it is acceptable to define impurity regions 141 and 142 as p-type impurity regions (a).

Figure 3C:
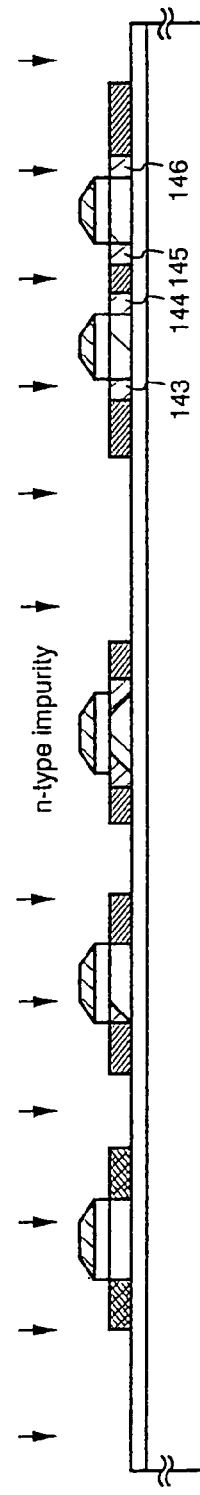

After removing resist mask 140, an n-type impurity element (phosphorus in the present embodiment) is added in a self-aligned manner by using gate electrodes 114 to 118 as masks. Thus formed impurity regions 143 to 146 are adjusted so that phosphorus is added at a concentration as much as ½ to/1;10 (typically ⅓ to/1;4) of that of the above stated n-type impurity region (b) (provided it is 5 to 10 times higher than the boron concentration added in the above stated channel doping process, typically $1\times10^{16}$ to $5\times10^{18}$ atoms/cm$^3$, typically $3\times10^{17}$ to $3\times10^{18}$ atoms/cm$^3$). Note that an impurity region containing an n-type impurity element at the above stated concentration range is defined as n-type impurity region (c) in the present specification. (FIG. 3C)

Note that though phosphorus is entirely added at a concentration of $1\times10^{16}$ to $5\times10^{18}$ atoms/cm$^3$ except for the portions that are hidden by the gate wiring in this process, this is not a specific problem. Further, though boron is added in the n-type impurity regions (c) 143 to 146 at a concentration of $1\times10^{15}$ to $1\times10^{18}$ atoms/cm$^3$ in the channel doping process, since phosphorus is added at a concentration as much as 5 to 10 times of boron contained in the p-type impurity region (b), it may be presumed that boron does not affect the function of n-type impurity region (b) in this case either.

Strictly speaking however, while the phosphorus concentration of a portion that overlaps the gate electrode among the n-type impurity regions (b) 121 and 122 remains at $2\times10^{16}$ to $5\times10^{19}$ atoms/cm$^3$, the portion that does not overlap the gate electrode is further added with phosphorus at a concentration of $1\times10^{16}$ to $5\times10^{18}$ atoms/cm$^3$, which means that phosphorus is contained at a slightly higher concentration.

Figure 3D:
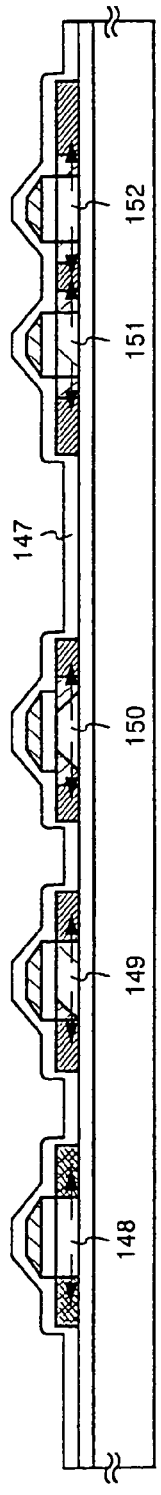

Next a protection film 147 comprising silicon oxynitride film is disposed to 200 nm thickness and a heat treatment process is performed in order to activate the impurity elements of n-type or p-type conductivity that have been doped at their respective concentrations. Furnace annealing, laser annealing or lamp annealing can be performed for this process. The activation process is performed by furnace annealing in embodiment 1. Heat treatment is performed in a nitrogen atmosphere at between 300 and 650° C. for 3 to 12 hours, typically from 400 to 550° C. for 4 to 6 hours, here at 450° C. for 2 hours. (FIG. 3D)

The catalytic element (nickel in embodiment 1) used in crystallization of an amorphous silicon film in embodiment 1 moved in the direction shown by the arrows and is captured in a region containing phosphorus at a high concentration (gettering) formed in the process of FIG. 3A. This is a phenomenon originated from gettering effect of a metal element by phosphorus. As a result, the concentration of nickel contained in later formed channel forming regions 148 to 152 is reduced below $1\times10^{17}$ atoms/cm$^3$ (preferably to $1\times10^{16}$ atoms/cm$^3$).

Conversely, the catalytic element precipitated at a high concentration in the regions which functioned as gettering sights of the catalytic element (regions where impurity regions 131 to 139 were formed in the process of FIG. 3A). The catalytic element existed in these regions at a concentration exceeding $5\times10^{18}$ atoms/cm$^3$ (typically $1\times10^{19}$ to $5\times10^{20}$ atoms/cm$^3$).

A hydrogenation process is next performed on the active layers by performing heat treatment in an atmosphere containing 3 to 100% hydrogen at 300 to 550° C. for 1 to 6 hours (350° C. for 2 hours in embodiment 1). This is a process to terminate dangling bonds in the semiconductor layers by thermally activated hydrogen. Plasma hydrogenation (using hydrogen activated by plasma) may be performed as another hydrogenation means.

The first interlayer insulating film 154 is next formed into 500 nm to 1.5 mm. In embodiment 1 the first inter layer insulating film 154 is formed by silicon oxide film into 800 nm thickness by plasma CVD. Needless to say, a laminate structure combining insulating films comprising silicon such as a laminate of a silicon nitride film and a silicon oxide film may also be adopted.

Further, it is possible to use organic resin films such as polyimide, acrylic, polyamide, polyimide amide, BCB (benzocyclobutene) for the first interlayer insulating film 154, if the heat resistance permits.

Figure 4A:
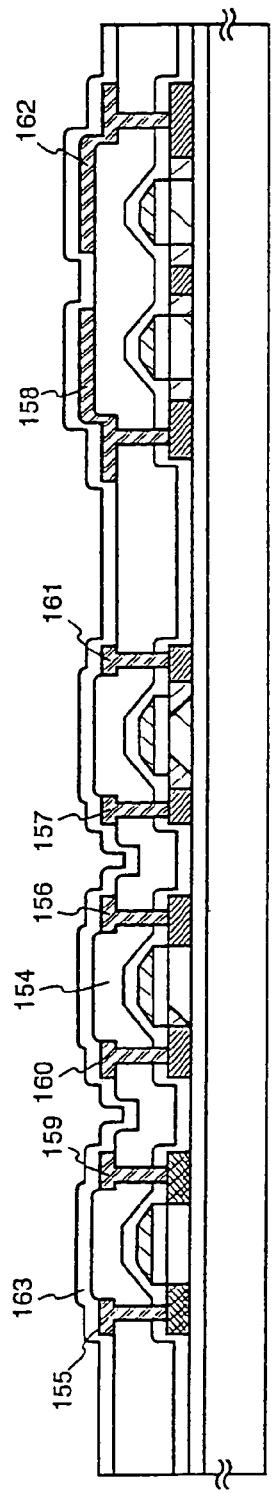
FIG. 4A–4B illustrates manufacturing steps of the pixel portion and the driver circuit.
Figure 4B:
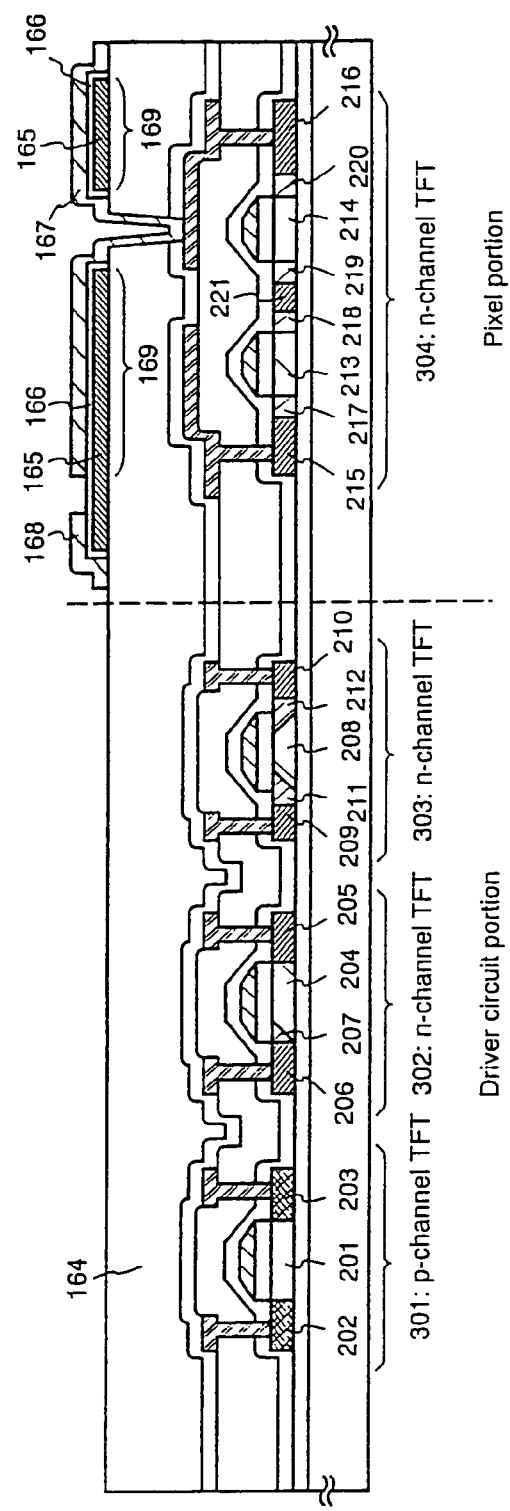

Contact holes are then formed in order to reach the source region or the drain region of the respective TFTs, and source wirings 155 to 158, and drain wirings 159 to 162 are formed. Note that, although not shown in the figures, the drain wirings 159 and 160 are electrically connected in order to form a CMOS circuit. Note that, although not shown in the figures, in embodiment 1 the electrodes are made with a three-layer structure laminate film of a 100 nm titanium film, a 300 nm aluminum film containing silicon, and a 150 nm titanium film formed successively by sputtering. (FIG. 4B)

A silicon nitride film, a silicon oxide film, or a silicon oxynitride film is formed to a thickness of between 50 and 500 nm (typically 200 to 300 nm) next as a passivation film 163. A plasma treatment using a gas that contains hydrogen such as $H_2$ and $NH_3$ may be performed precedent to formation of the film and heat treatment may be performed after the film formation. The preceding process provides excited hydrogen into the first interlayer insulating film. By performing a heat treatment to this state, the active layers are effectively hydrogenated because hydrogen added into the first interlayer insulating film is diffused in the layer underneath, as well as improving the film quality of passivation film 163.

Further, after forming the passivation film 163, an additional hydrogenation process may be performed. For example, it is good to perform heat treatment for 1 to 12 hours at between 300 and 450° C. in an atmosphere containing from 3 to 100% hydrogen. Or, a similar result can be obtained by using plasma hydrogenation. Note that openings may be formed here in the passivation film 163 at positions where contact holes will be formed later in order to connect the pixel electrode and the drain wirings.

A second interlayer insulating film 164 made from an organic resin is formed next with an approximately 1 μm thickness. Polyimide, acrylic, polyamide, polyimide amide, BCB (benzocyclobutene), etc., can be used as the organic resin. The following points can be given as the benefits of using an organic resin film: easy film deposition; the parasitic capacitance can be reduced because the specific dielectric constant is low; and superior levelness. Note that in addition to the above, other organic resin films, organic SiO compounds, etc. can be used. A thermal polymerization type polyimide is used here, and after application to the substrate, it is baked at 300° C. to form the film.

Further, it is possible to provide a resin film colored by pigment etc. as a part of layer of the second interlayer insulating film 164 and use it as the color filter.

A silicon oxide film (not shown in the figure) is formed to 30 nm thickness over the second interlayer insulating film 164, and then a shielding film 165 is formed thereon in the region that becomes the pixel section. Further, by using the resist mask that was used at the formation of the shielding film 165, silicon oxide of an underlayer, is removed.

The shielding film 165 is a film formed from an element chosen from among aluminum (Al), titanium (Ti), tantalum (Ta), chromium (Cr), and tungsten (W) or a film that has one of these elements as its principal constituent, formed to a thickness of between 100 and 300 nm. In embodiment 1 an aluminum film containing titanium at 1 wt % is formed into 125 nm thick.

Note that the silicon oxide film disposed on the second interlayer insulating film 164 can improve the adhesiveness of the shielding film formed on top. Further, if plasma processing using $CF_4$ gas is performed on the surface of the second interlayer insulating film 164, which is formed by an organic resin, then the adhesiveness to the shielding film formed on this film can be increased by surface refinement.

Further, it is possible to form other connecting wirings, not only the shielding film, by using the aluminum film containing titanium. For example, a connecting wiring for connecting between circuits can be formed inside the driver circuit. In this case however, before depositing the material that forms the shielding film or the connecting wiring, it is necessary to form contact holes in advance, in the second interlayer insulating film 164.

Next, an oxide substance 166 with a thickness from 20 to 100 nm (preferably between 30 and 50 nm) is formed on the surface of the shielding film 165 by publicly known anodic oxidation or plasma oxidation. An aluminum oxide film (alumina film) is formed here as the oxide substance 166 because a film containing aluminum as its principal constituent, is used as the shielding film 165 in embodiment 1.

Further, the structure used here has the insulating film being formed only on the surface of the shielding film by anodic oxidation, but the insulating film may also be formed by other gas phase method, such as plasma CVD, thermal CVD, or sputtering. In that case also, it is preferable to make the film thickness from 20 to 100 nm (more preferably between 30 and 50 nm). Furthermore, a silicon oxide film, a silicon nitride film, a silicon oxynitride film, a DLC (diamond like carbon) film, or an organic resin film may also be used. Further, a combined laminate film of these may be used, too.

Contact holes are formed next in the second interlayer insulating film 164 and in the passivation film 163 in order to reach the drain wiring 162, and the pixel electrode 167 is formed. Note that pixel electrode 168 is a pixel electrode of an adjoining pixel. A transparent conductive film may be used for the pixel electrodes 167 and 168 for the case of a transmission type liquid crystal display device, while a metallic film may be used for the case of reflective type liquid crystal display device. An indium tin oxide (ITO) with a thickness of 110 nm is formed here by sputtering because a transmission type liquid crystal display device is used here.

Further, a storage capacitor 169 is formed at this point where the pixel electrode 167 and the shielding film 165 overlap by interposing the oxide substance 166. In this case it is preferable to set the shielding film 165 at floating state (electrically isolated state) or a constant electric potential, more preferably at a common electric potential (median electric potential of image signals sent as data).

Thus, the active matrix substrate which comprises a driver circuit and a pixel section on the same substrate, is completed. Note that in FIG. 4B a p-channel TFT 301, and n-channel TFTs 302 and 303 are formed in the driver circuit, and that a pixel TFT 304 is formed from an n-channel TFT in the pixel section.

Note that the process order of embodiment 1 may be properly altered. Whatever the order may be, the basic function of the active matrix substrate does not differ as long as the structure of finally formed TFT is one shown in FIG. 4B, and the effect of the present invention is not impaired.

A channel forming region 201, a source region 202 and a drain region 203 are each formed in the p-channel TFT 301 of the driver circuit by a p-type impurity region (a). Note that a region that contains phosphorus at a concentration of $1 \times 10^{20}$ to $1 \times 10^{21}$ atoms/cm$^3$ exists in a portion of a source region or a drain region in effect. Further in that region the catalytic element gettered in the process of FIG. 3D exists at a concentration exceeding $5 \times 10^{18}$ atoms/cm$^3$ (typically $1 \times 10^{19}$ to $5 \times 10^{20}$ atoms/cm$^3$).

Further, a channel forming region 204, a source region 205, and a drain region 206 are formed in the n-channel TFT 302, and a LDD region overlapping with the gate wiring by interposing a gate insulating film 207 is formed in one side of the channel forming region (drain region side). Here, LDD region 207 contains phosphorus at a concentration of $2 \times 10^{16}$ to $5 \times 10^{19}$ atoms/cm$^3$, and is formed to completely overlap with the gate wiring.

Further, as described above, it is presumed that the LDD region 207 has a concentration gradation of the impurity element (phosphorus in this case) inside by reflecting the shape of the tapered section of the gate electrode. In other words, phosphorus concentration becomes high as getting close to the drain region 206 neighboring to the LDD region 207 (as getting further from the channel forming region 204).

A channel forming region 208, a source region 209, and a drain region 210 are formed in the n-channel TFT 303. LDD regions 211 and 212 are formed in both sides of the channel forming region. Note that the regions overlapping with the gate wiring by interposing an insulating film and the regions that are not overlapped with the gate wiring are realized because a portion of the LDD regions 211 and 212 are placed so as to overlap with the gate wiring in this structure.

Figure 7:
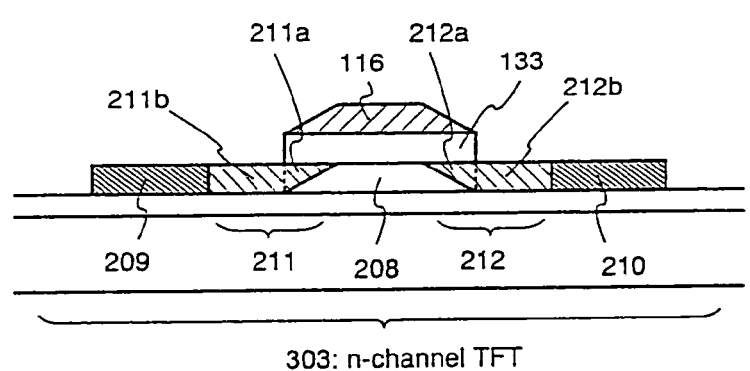
FIG. 7 illustrates the LDD structure of an n-channel TFT.

A cross sectional view shown in FIG. 7 is an enlarged diagram showing n-channel TFT 303 shown in FIG. 4B in the state of being manufactured to the process of FIG. 3C. As shown here, LDD region 211 is further classified into LDD region 211a and LDD region 211b. Phosphorus is contained in the LDD region 211a at a concentration of $2 \times 10^{16}$ to $5 \times 10^{19}$ atoms/cm$^3$, whereas it is contained at a concentration 1 to 2 times as much (typically 1.2 to 1.5 times) in the LDD region 211b.

Further, channel forming regions 213 and 214, a source region 215, a drain region 216, LDD regions that do not overlap the gate electrode 217 to 220, and an n-type impurity region (a) 221 contacting the regions 218 and 219 are formed in the pixel TFT 304. The source region 215, and the drain region 216 are each formed by n-type impurity region (a) at this point, and the LDD regions 217 to 220 are formed by impurity region (c).

The structure of TFTs that comprise a circuit or an element is optimized in correspondence with the performance required by the pixel section and the driver circuit, so that the operation performance and the reliability of a semiconductor device can be increased. In concrete, a TFT structure which imposes importance on high speed operation or counter measure to hot carrier, and a TFT structure which imposes importance on low OFF current operation can be realized over a same substrate by differing the disposition of LDD region and by property using a LDD region that overlaps a gate electrode and a LDD region that does not overlap a gate electrode in n-channel TFTs in accordance with the required performance.

Further, in forming LDD region that overlaps the gate electrode by interposing a gate insulating film, an enhanced effect of relieving electric field in the LDD region is expected by forming concentration gradation of the impurity element in the LDD region (phosphorus in the present embodiment).

For the case of an active matrix type liquid crystal display device, for example, the n-channel TFT 302 is suitable for driver circuits that place great importance on high speed, such as a shift register circuit, a frequency divider circuit (a signal divider circuit), a level shifter circuit, and a buffer circuit. In other words, by placing the LDD region 207 in only one side (the drain region side) of the channel forming region, this becomes a structure that reduces the resistive constituents as much while placing great importance on hot carrier countermeasures. This is because, for the case of the above circuit group, the source region and the drain region functions do not change, and the carrier (electron) movement direction is constant. However, if necessary, LDD regions can be placed in both sides of the channel forming region.

Further, the n-channel TFT 303 is suitable for a sampling circuit (also referred to as a sample and hold circuit) which places emphasis on both hot carrier countermeasures and low off current operation. In other words, hot carrier countermeasures can be realized by placement of the LDD regions 211a and 212a that overlap the gate electrode, and in addition, low off current operation is realized by placement of the LDD regions 211b and 212b that do not overlap the gate electrode. Furthermore, the functions of the source region and the drain region of a sampling circuit reverse, and the carrier movement direction changes by 180°; therefore a structure that has linear symmetry with the center of the gate wiring must be used. Note that it is possible not to form LDD regions 211b and 212b, depending upon the circumstances.

Further, the n-channel TFT 304 is suitable for a pixel section or a sampling circuit which place great importance on low off current operation. Namely, the LDD region overlapped with the gate electrode, which is a cause of an increase in the OFF current value, is not employed, only the LDD regions not overlapping the gate electrode are disposed, allowing low OFF current operation to be realized. Furthermore, by utilizing an LDD region with a concentration lower than that of the driver circuit LDD region, although the ON current value will fall a little, it is a thorough measure for lowering the OFF current value.

Additionally, it has been confirmed that an n-type impurity region (a) 221 is extremely effective in lowering the OFF current value.

Further, the length (width) of the LDD region 207 of the n-channel TFT 302 may be between 0.1 and 3.0 µm, typically from 0.2 to 1.5 µm, for a channel length of 3 to 7 µm. Further, the length (width) of the LDD regions 211a and 212a of the n-channel TFT 303 may be from 0.1 to 3.0 µm, typically between 0.2 and 1.5 µm, and the length (width) of the LDD regions 211b and 212b may be from 1.0 to 3.5 µm, typically between 1.5 and 2.0 µm. Moreover, the length (width) of the LDD regions 217 to 220 formed in the pixel TFT 304 may be from 0.5 to 3.5 µm, typically between 2.0 and 2.5µm.

Another characteristic of the present invention is that the p-channel TFT 301 is formed in self-aligned manner, and n-channel TFTs 302 to 304 are formed in non self-aligned manner.

By using alumina film which has high dielectric constant of 7 to 9 for the dielectric of the storage capacitor in this embodiment, it became possible to reduce the occupied area in which a required capacitor is formed. Further, by using the shielding film formed over pixel TFT as one of the electrodes for the storage capacitor as in embodiment 1, the aperture ratio in the image display section of the active matrix liquid crystal display device can be increased.

The structure of the storage capacitor of the present invention is not necessarily limited to the one shown in embodiment 1. For example, the storage capacitor described in Japanese Patent Application No. Hei 9-316567 or Japanese Patent Application No. Hei 10-254097 may be used.

[Embodiment 2]

Figure 5:
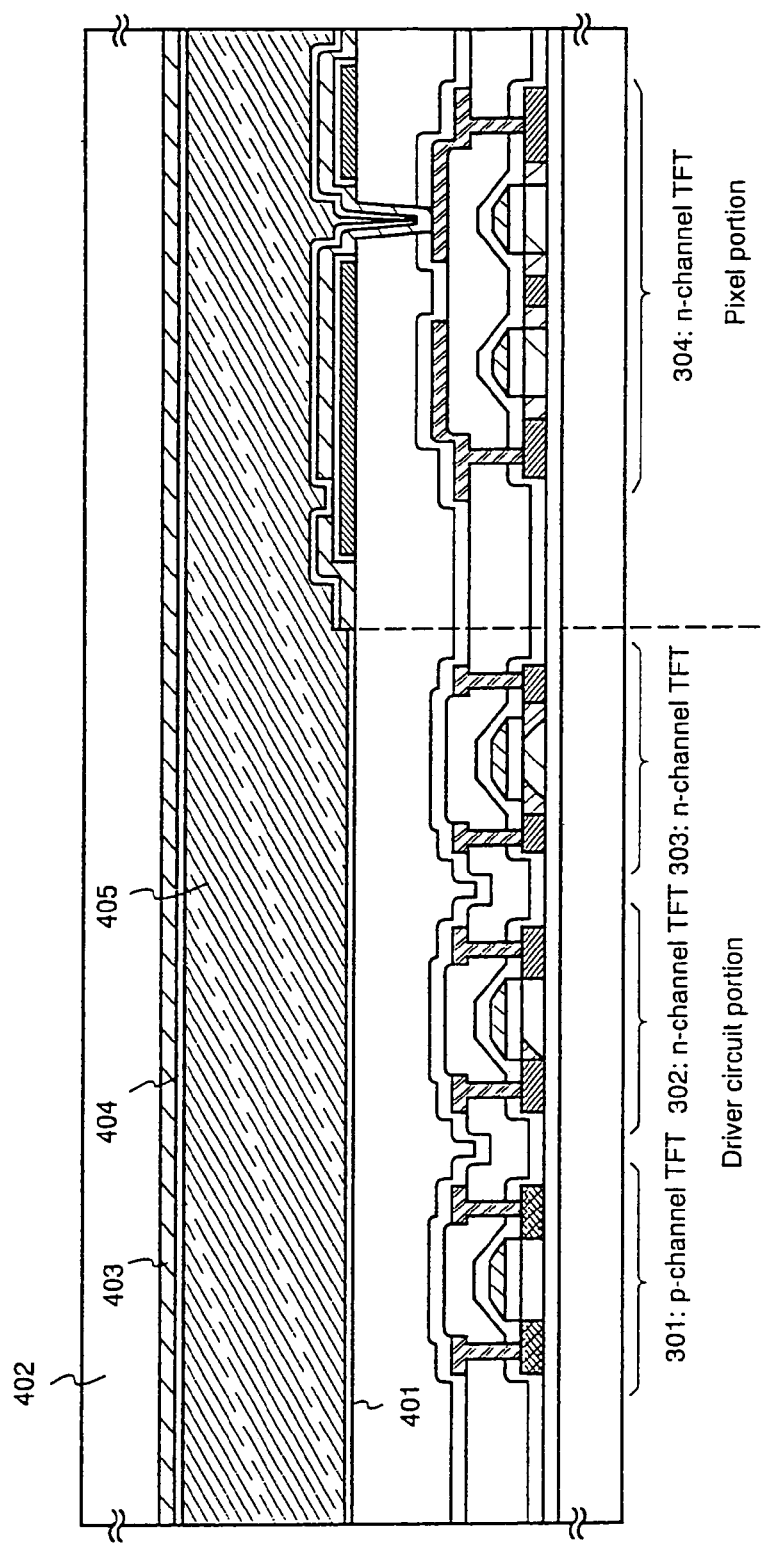
FIG. 5 is a sectional structural view of an active matrix liquid crystal display device.

A process of manufacturing an active matrix type liquid crystal display device from an active matrix substrate is next explained. As shown in FIG. 5, an alignment film 401 is formed for the substrate in the state of FIG. 4B. In the present embodiment, a polyimide film is used for the alignment film. An opposing electrode 403 comprising transparent conductive film and an alignment film 404 are formed on an opposing substrate 402. Color filter or a shielding film may be formed on the opposing substrate if necessary.

After forming the alignment films, a rubbing process is performed to give the liquid crystal molecules a certain fixed pre-tilt angle, so that they are aligned. The active matrix substrate, on which a pixel section and driver circuits are formed, and the opposing substrate are stuck together through a sealing material, spacers, or a resin film provided by patterning (not shown in the figures) in accordance with a known cell assembly process. A liquid crystal material 405 is next injected between both substrates, and the cell is completely sealed by a sealant (not shown in the figures). A known liquid crystal material may be used as the liquid crystal material. Thus the active matrix type liquid crystal display device shown in FIG. 5 is completed.

Figure 8:
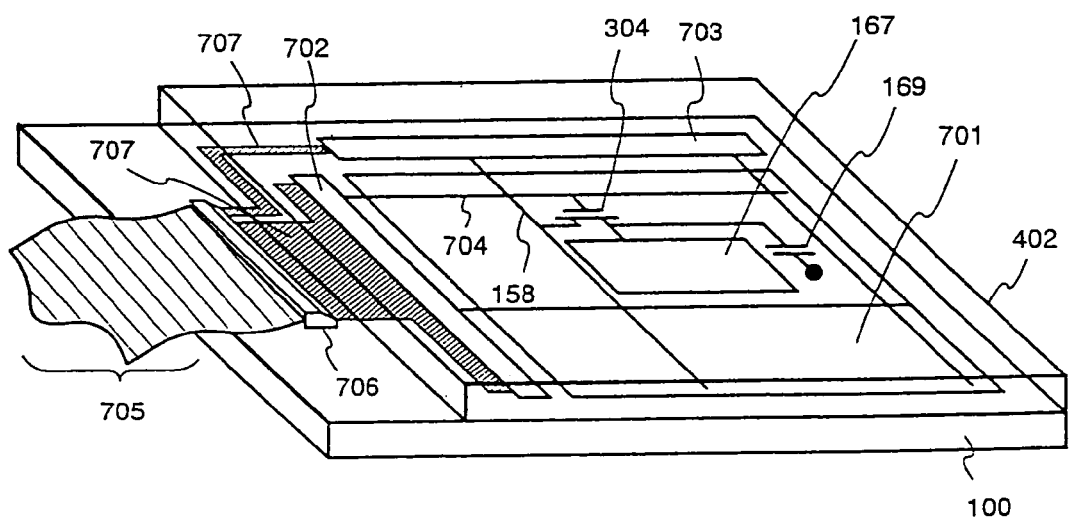
FIG. 8 is a perspective view of an active matrix liquid crystal display device.

The structure of the active matrix liquid crystal display device is next described by referring to the perspective view of FIG. 8. In order to correspond FIG. 8 to cross sectional view of FIGS. 1A to 4B, common reference numerals are used. The active matrix substrate comprises a pixel section 701, scanning (gate) signal driver circuit 702, image (source) signal driver circuit 703 formed over a glass substrate 100. A pixel TFT 304 of the pixel section is an n-channel TFT, and driver circuits disposed to surround the pixel circuit are basically formed from CMOS circuits. Scanning signal driver circuit 702 and image signal driver circuit 703 are respectively connected to the pixel section 701 through gate wiring 704 and source wiring 158. An input-output signal wiring 707 is disposed from external input-output terminal 706 which is connected to FPC 705, to the input-output terminal of the driver circuit.

[Embodiment 3]

Figure 9:
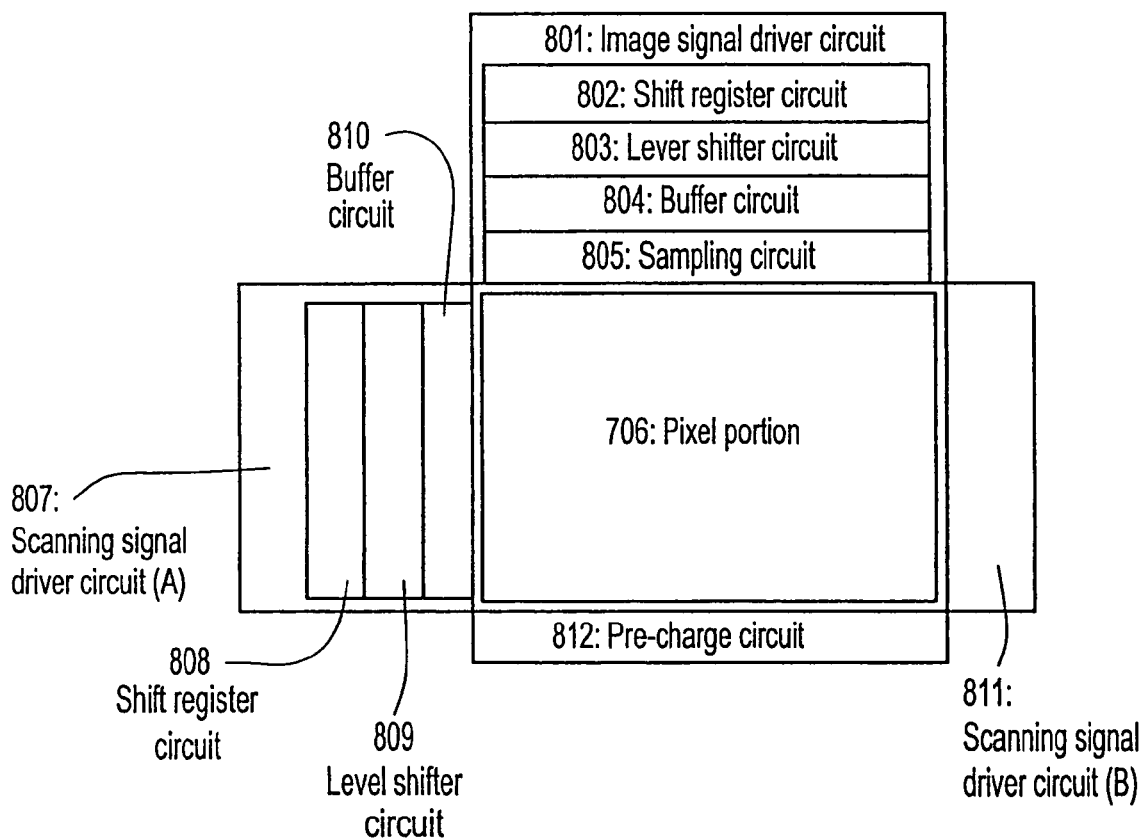
FIG. 9 is a circuit block diagram of an active matrix liquid crystal display device.

FIG. 9 shows an example of circuit structure of the active matrix substrate shown in embodiment 2. The active matrix substrate of embodiment 3 has a image signal driver circuit 801, a scanning signal driver circuit (A) 807, a scanning signal driver circuit (B) 811, a pre-charge circuit 812, and a pixel section 806. Through the Specification, driver circuit is a generic name including image signal driver circuit 801 and a scanning signal driver circuit 807.

The image signal driver circuit 801 is provided with a shift register circuit 802, a level shifter circuit 803, a buffer circuit 804, and a sampling circuit 805. Further, the scanning signal driver circuit (A) 807 is provided with a shift register circuit 808, a level shifter circuit 809, and a buffer circuit 810. The scanning signal driver circuit (B) 811 has a similar structure.

The driver voltages for the shift register circuits 802 and 808 is between 5 and 16 V here (typically 10 V), and the structure shown by reference numeral 302 in FIG. 4B is suitable for n-channel TFTs used in the CMOS circuits forming the circuits.

Furthermore, the driver voltage becomes high at between 14 and 16 V for the level shifter circuits 803 and 809, and the buffer circuits 804 and 810, but similar to the shift register circuits, CMOS circuits containing the n-channel TFT 302 shown in FIG. 4B are suitable. Note that using a multi-gate structure, such as a double gate structure and a triple gate structure for the gate wiring is effective in increasing reliability in each circuit.

Further, the sampling circuit 805 has a driver voltage of between 14 and 16 V, but the source region and the drain region are inverted and it is necessary to reduce the off current value, so CMOS circuits containing the n-channel TFT 303 of FIG. 4B are suitable. Note that only the n-channel TFT is shown in FIG. 4B, but in practice the n-channel TFT and a p-channel TFT are combined when forming the sampling circuit.

Further, the pixel section 806 has a driver voltage of between 14 and 16 V, but it is necessary to reduce the off current value even lower than that of the sampling circuit 805. Therefore it is preferable to use n-channel TFT 304 of FIG. 4B for the pixel TFT.

Note that the structure of embodiment 3 can be easily realized by manufacturing a TFT according to manufacturing method shown in embodiment 1. Though the embodiment 3 shows only the structures of pixel section and driver circuit, it is possible to form a frequency divider circuit (signal divider circuit), D/A converter circuit, operational amplifier circuit, g compensation circuit, and further signal processing circuits (they may also be referred to as logic circuits) such as a memory and a micro processor over a same substrate by following the manufacturing method of embodiment 1.

As stated above, the present invention enables to materialize a semiconductor device comprising a pixel section and a driver circuit for driving the pixel section over a substrate, such as a semiconductor device having a signal processing circuit, a driver circuit and a pixel circuit over a same substrate.

[Embodiment 4]

In the present embodiment, an active matrix liquid crystal display device having a pixel portion structured differently from that of Embodiment 2 is described with reference to FIG. 10. Since its basic structure is similar to the structure illustrated in FIG. 5, only different portions are described.

Figure 10:
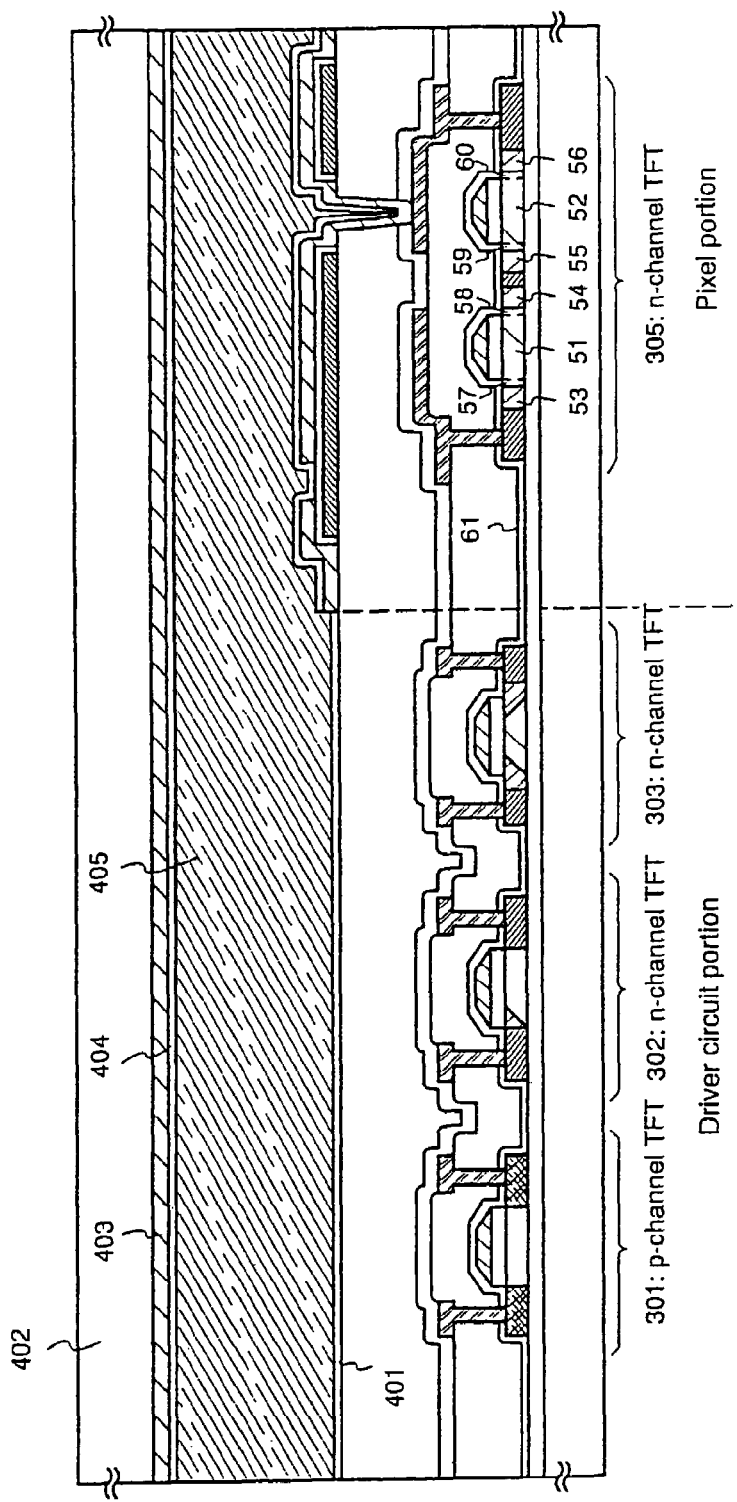
FIG. 10 is a sectional structural view of an active matrix liquid crystal display device.

The structure illustrated in FIG. 10 is different from that of Embodiment 2 in the structure of a pixel TFT (n-channel TFT) 305 forming the pixel portion. More specifically, in the present embodiment, the structure illustrated in FIG. 10 is different in that offset regions 57–60 are formed between channel forming regions 51 and 52 and LDD regions 53–56 made of n-type impurity regions (c), respectively.

It is to be noted that an offset region means, as 57–60, a semiconductor region the composition of which is the same as that of a channel forming region (the impurity element contained in the region is the same as that contained in the channel forming region) and which does not overlap a gate electrode through a gate insulating film. The offset regions 57–60 function as mere resistance regions and are highly effective in decreasing the OFF current value.

In order to materialize such a structure, for example, in the process illustrated in FIG. 3C in Embodiment 1, before adding the n-type impurity element, an insulating film 61 comprising silicon is formed at the thickness of 20–200 nm (preferably 25–150 nm) so as to cover the gate wiring and the like.

It is to be noted that the structure of the present embodiment can be materialized by modifying part of the processes described in Embodiment 1, and can be freely combined with both structures described in Embodiments 2 and 3.

[Embodiment 5]

Figure 11:
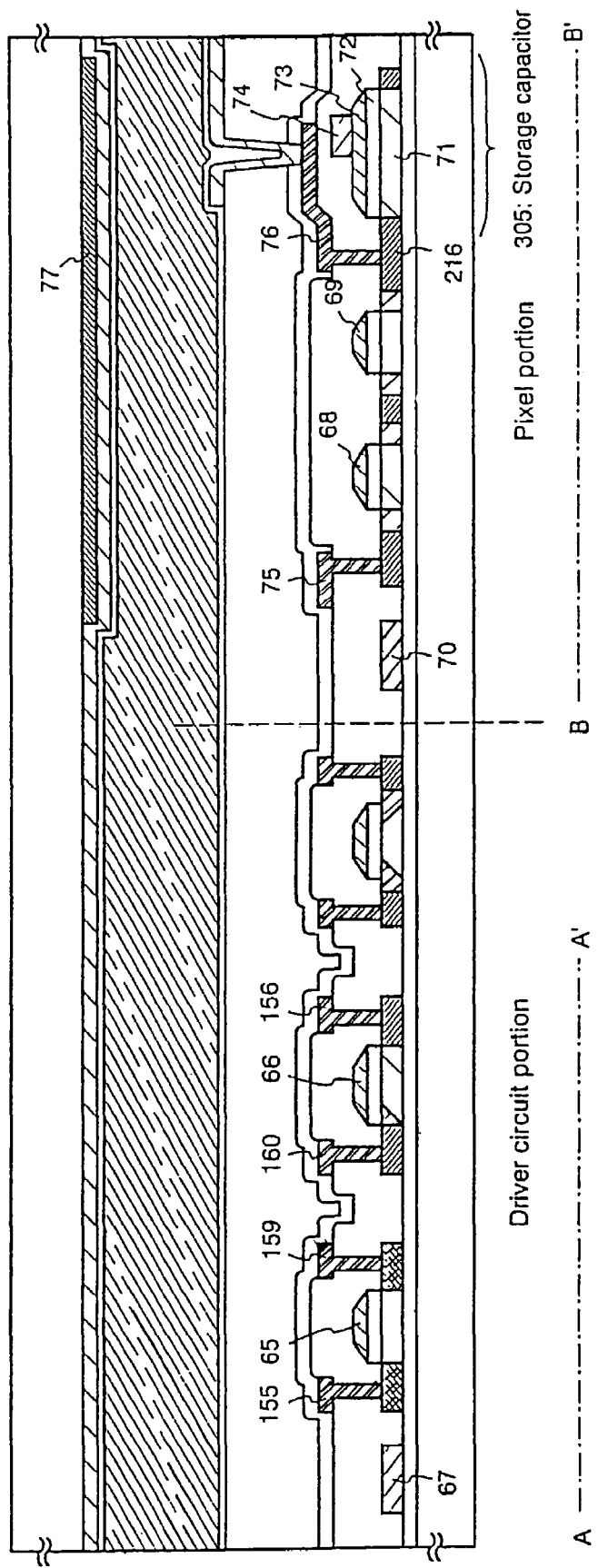
FIG. 11 is a sectional structural view of an active matrix liquid crystal display device.

In the present embodiment, an active matrix liquid crystal display device structured differently from that of Embodiment 2 is described. FIG. 11 is a sectional structural view of an active matrix liquid crystal display device of the present embodiment. Since its TFT structure forming the driver circuit and the pixel portion is basically similar to the structure described in Embodiment 1, only different portions are described. The description is made referring to the reference numerals used in FIGS. 1A–5 as the need arises.

The active matrix liquid crystal display device illustrated in FIG. 11 is characteristic in that, in the driver circuit, gate electrodes 65 and 66 and a gate wiring 67 are formed of different materials. More specifically, in the present embodiment, the gate electrodes 65 and 66 are formed of a laminated film formed by laminating a tantalum nitride film and a tantalum film, while the gate wiring 67 is formed of an aluminum film (including an aluminum alloy film).

Figure 12A:
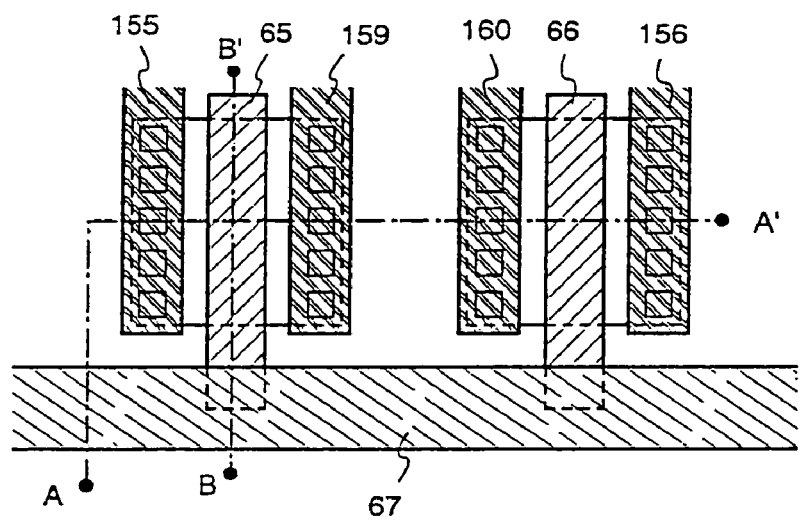
FIG. 12A–12B illustrates the structure of a CMOS circuit.
Figure 12B:
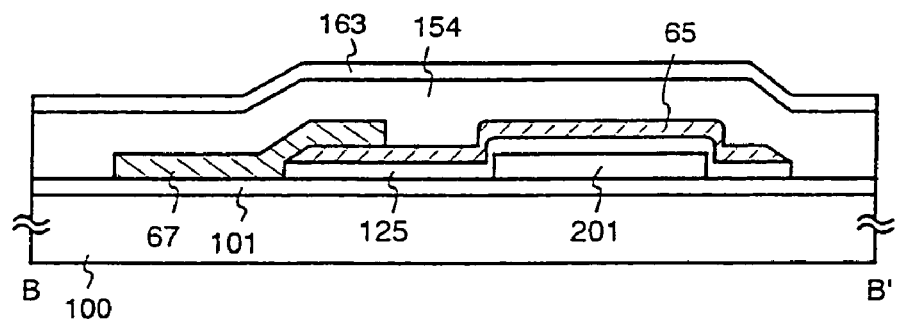

Here, a sectional view shown by A–A' in FIG. 11 is a sectional view taken along the line A–A' in a plan view of FIG. 12A. FIG. 12B is a sectional view taken along the line B–B' of FIG. 12A.

In the present embodiment, as shown in FIG. 12A, the gate electrodes 65 and 66 are not required to have very low resistivity, and thus, a material which can be tapered as easily as possible may be selected. This is the reason that the laminated film formed by laminating the tantalum nitride film and the tantalum film is used in the present embodiment. On the other hand, since the gate wiring 67 is required to transmit signals over a long distance, and thus, it is preferable that the gate wiring 67 is formed of a material having the lowest possible resistivity. This is the reason that the aluminum film is used in the present embodiment.

It is to be noted that, as illustrated in FIGS. 12A and 12B, end portions of the gate electrodes 65 and 66 are directly connected with the gate wiring 67. Here, since the electrical connection is made directly without an interlayer insulating film, processes for forming such an interlayer insulating film, providing contact holes, and the like can be eliminated, which is, of course, on the assumption that no insulating film is formed on the gate electrodes 65 and 66.

The same can be said with regard to the structure of the pixel portion. Gate electrodes 68 and 69 and a gate wiring 70 are formed of different materials. More specifically, the gate electrodes 68 and 69 are formed of a laminated film formed by laminating a tantalum nitride film and a tantalum film, while the gate wiring 70 is formed of an aluminum film (including an aluminum alloy film).

Figure 13A:
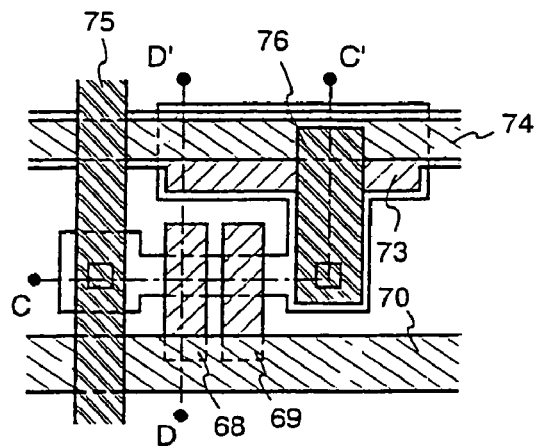
FIG. 13A–13B illustrates the structure of a pixel portion.
Figure 13B:
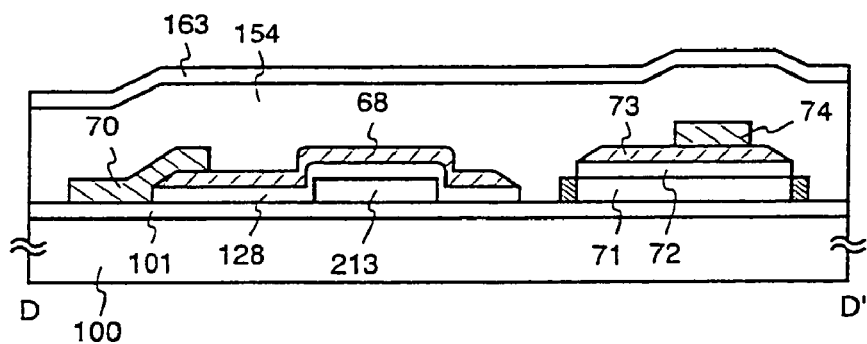

Here, a sectional view shown by C–C' in FIG. 11 is a sectional view taken along the line C–C' in a plan view of FIG. 13A. FIG. 13B is a sectional view taken along the line D–D' of FIG. 13A. In this case also, as illustrated in FIGS. 13A and 13B, end portions of the gate electrodes 68 and 69 can be directly connected with the gate wiring 70.

Further, in the present embodiment, a storage capacitance 305 which is differently structured from that in Embodiment 1 is formed in the pixel portion. An electrode (hereinafter referred to as a capacitance electrode) 73 for forming the storage capacitance is formed on a semiconductor region 71 electrically connected with a drain region 216 through an insulating film (hereinafter referred to as a capacitance insulating film) 72 formed simultaneously with the gate insulating film for forming the storage capacitance. Further, a capacitance wiring 74 electrically connected with the capacitance electrode 73 is formed on the capacitance electrode 73. Reference numerals 75 and 76 denote a source wiring and a drain wiring, respectively.

Further, in the present embodiment, a shielding film 77 is provided not on the side of the active matrix substrate but on the side of the opposing substrate.

The above-described structure can be materialized by modifying the manufacturing processes of Embodiment 1. After the process illustrated in FIG. 3C is completed, the activation process is carried out without forming the protective film 152 on the same conditions as those of Embodiment 1.

However, in order to materialize the structure of the present embodiment, it is necessary to pay full attention to the oxygen concentration in the atmosphere used in this heat treatment process. In the present embodiment, since the heat treatment is carried out with the tantalum film as the material for forming the gate electrodes being exposed, if the surface of the gate electrodes is oxidized, not only the surface is covered with an insulating film but also the resistivity greatly increases. As described later, if the surface is covered with an insulating film, connection with a gate wiring in a later process is difficult. Accordingly, in the present embodiment, the concentration of oxygen contained in the nitrogen atmosphere is made to be 1 ppm or less (preferably 0.1 ppm or less), and the substrate is carried into and out of the electric heating furnace preferably after the furnace temperature becomes 150° C. or lower.

The surface of the gate electrodes is thought to be nitrated to form a nitride by carrying out the activation process (in the present embodiment, the furnace annealing process) on the above-described conditions. However, since an insulating film is not formed, conductive surface is exposed.

After the activation process is completed, the gate wirings 67 and 70 formed of an aluminum film are formed. It is to be noted that, here, in addition to the gate wirings 67 and 70, an input/output signal wiring (not shown) for transmitting a signal from the external to the driver circuit may be formed. An input/output signal wiring as used herein generically refers to an input signal wiring or an output signal wiring for transmitting to a semiconductor circuit various kinds of signals such as a control signal (a start pulse signal, a clock signal, and the like) and a signal including image information transmitted to a driver circuit of a semiconductor device from an external input/output terminal such as an FPC (flexible print circuit).

In the present embodiment, by using a conductive film formed of aluminum, copper, or silver (including alloys thereof) as the material for forming the input/output signal wiring (wiring denoted as 707 in FIG. 8) and the gate wirings 67 and 68, wirings the resistivity of which is as low as 0.1–10 $\mu\Omega$cm are materialized. Though aluminum has problems, for example, that hillocks are liable to be formed when it is heated, since, in the present embodiment, the wirings are formed after all heat treatment processes which may cause hillocks in the aluminum film are carried out, there is no problem caused.

It is to be noted that the above-described wirings having low resistivity are often used in particular portions such as the input/output signal wiring and part of the gate wirings. In particular, since it is difficult to minutely process an aluminum film to have the line width of 2 $\mu$m or less, aluminum is not appropriate as the material of the gate electrodes which require minute processing and of wirings for connection in the driver circuit which require high density integration. Since the resistance of the gate wirings and of short wirings for connecting TFTs with each other in the driver circuit is not a matter of importance, a tantalum film or the like is enough as their material.

It is to be noted that the structure of the present embodiment can be freely combined with any structure described in Embodiments 2–4.

[Embodiment 6]

In the structure described in Embodiment 5, any low resistance material may be used as the gate wirings. More specifically, other than the aluminum film described in Embodiment 5, a film made of copper or the main component of which is copper, a film made of silver or the main component of which is silver, or a laminated film of a combination thereof may be used.

Further, a film formed of a material such as titanium, titanium nitride, tantalum, tantalum nitride, tungsten, tungsten nitride, molybdenum, niobium may be laminated to the above-described thin film made of aluminum, copper, or silver. The order of the lamination does not matter, and the gate Wiring may be a triple laminated structure where the low resistance material is sandwiched. These films are particularly effective when the aluminum film is used as the gate wirings, and can prevent hillocks from being formed.

In addition, the above-described thin film made of aluminum, copper, or silver is very liable to be oxidized, and thus, very liable to cause malinsulation. Therefore, by laminating the thin film made of titanium or the like on the upper surface of the gate wirings, electrical contact with other wirings can be easily secured.

It is to be noted that the structure of the present embodiment can be freely combined with any structure described in Embodiments 2–5.

[Embodiment 7]

While, in Embodiment 1, a case where the semiconductor film containing crystal structure is formed using a catalytic element for facilitating the crystallization is described, in the present embodiment, a case where a semiconductor film containing crystal structure is formed using thermal crystallization or laser crystallization and without using such a catalytic element is described.

In case of thermal crystallization, after a semiconductor film containing amorphous structure is formed, a heat treatment process is carried out at 600–650° C. for 15–24 hours. By carried out the heat treatment at 600° C. or above, natural nuclei are generated and the crystallization progresses.

In case of laser crystallization, after a semiconductor film containing amorphous structure is formed, a laser annealing process is carried out on the first annealing condition described in Embodiment 1. This makes it possible to form a semiconductor film containing crystal structure in a short time. Of course, lamp annealing can be carried out instead of laser annealing.

As described in the above, the semiconductor film containing crystal structure used in the present invention can be formed using any known means. It is to be noted that the present embodiment can be freely combined with any structure described in Embodiments 1–6.

[Embodiment 8]

A case of forming an active matrix substrate from a different manufacturing process from that of embodiment 1 is described in embodiment 8.

In embodiment 1, a technique in which crystallization process is performed by using the technique disclosed in Japanese Patent Application Laid-Open Hei 7-130652 and then gettering the catalyst element used in the crystallization into source and drain regions at the same time with activation of source and drain regions, was used.

However it is also possible to use the technique disclosed in Japanese Patent Application Laid-Open Hei 10-270363 for the processes of crystallization through gettering. In the case of using the technology disclosed in this gazette, after performing crystallization process using catalyst element, a region containing an element belonging to periodic table Group 15 (typically phosphorus) is selectively formed and the catalyst element is gettered into the region.

Further as another method, it is possible to use the technique disclosed in Japanese Patent Application Laid-Open No. Hei 10-247735 for the processes from crystallization process through gettering process.

As described above, the semiconductor film including crystallization structure used in the present invention may be formed from various methods from public domain. Note that the structure of embodiment 8 can be freely combined with the structures of embodiments 1 to 7.

[Embodiment 9]

It is possible to use the present invention when forming an interlayer insulating film on a conventional MOSFET, and then forming TFTs on that. In other words, it is possible to realize a semiconductor device with a three dimensional structure. Further, it is possible to use an SOI substrate such as SIMOX, Smart-Cut (a trademark of SOITEC corporation), or ELTRAN (a trademark of Cannon, Inc.).

Note that it is possible to freely combine the structure of embodiment 9 with the structure of any of embodiments 1 to 8.

[Embodiment 10]

Figure 14:
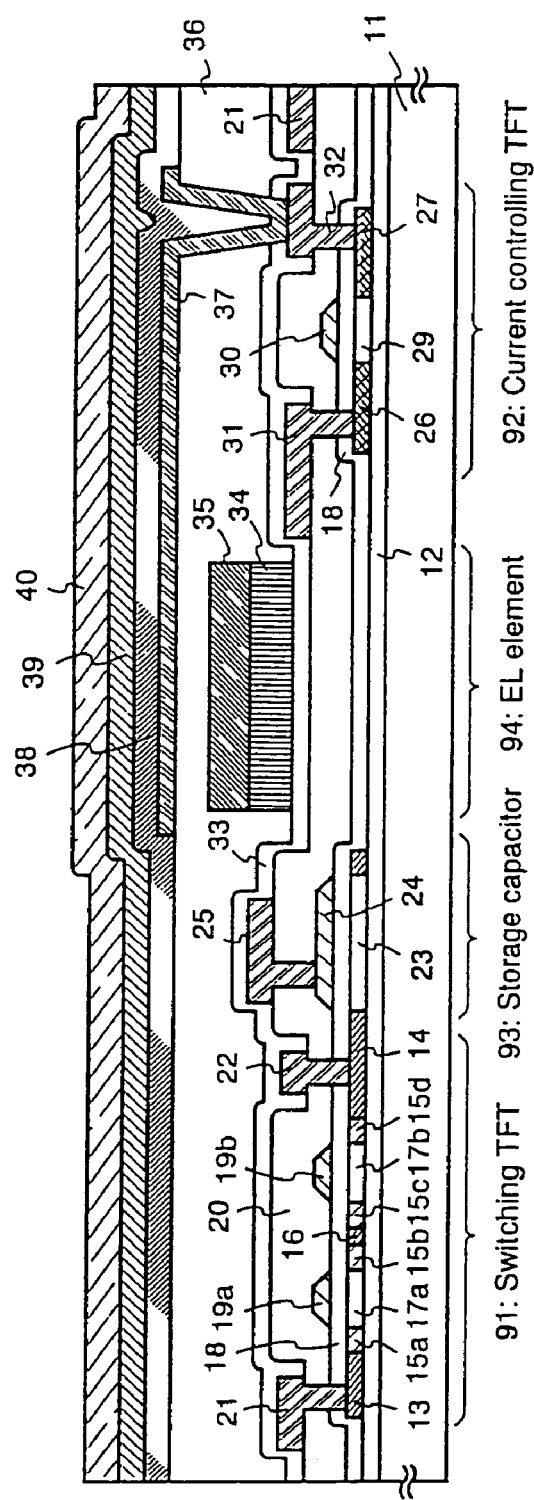
FIG. 14 illustrates the structure of an EL display device.

The structure of the present invention may also be applied to an EL display device. In the present embodiment, a case where the present invention is implemented in a pixel portion of an EL display device (in particular, an active matrix EL display) is described with reference to FIG. 14.

Here, two TFTs 91 and 92 are formed in a pixel. The TFT 91 functions as a switching element (hereinafter referred to as a TFT for switching), and the TFT 92 is a TFT for controlling the amount of electric current to an EL element (hereinafter referred to as a TFT for current controlling). The TFT 91 is an n-channel TFT while the TFT 92 is a p-channel TFT. Though the TFT for current controlling is a p-channel TFT here, an n-channel TFT may also be used.

The TFT 191 for switching is formed over a substrate 11, on which a base film 12 is formed, so as to have an active layer including a source region 13, a drain region 14, LDD regions 15a–15d, a heavily doped impurity region 16, and channel forming regions 17a and 17b, a gate insulating film 18, gate electrodes 19a and 19b, a first interlayer insulating film 20, a source wiring 21, and a drain wiring 22. It is to be noted that the gate electrodes 19a and 19b are electrically connected with each other to form a double-gate structure.

The TFT 91 for switching is connected with a storage capacitance 93. The storage capacitance 93 is formed of a semiconductor region 23 for capacitance forming which is electrically connected with the drain region 14, a gate insulating film 18 (which functions as a dielectric for capacitance forming in the region where the storage capacitance 93 is formed), and an electrode 24 for capacitance forming. It is to be noted that a connection wiring 25 is a wiring for giving fixed potential (here, the ground potential) to the electrode 24 for capacitance forming, and is simultaneously formed with the source wiring 21 and the drain wiring 22.

Here, in the TFT 91 for switching, the LDD regions 15a–15d are provided so as not to overlap the gate electrodes 19a and 19b through the gate insulating film 18. When selected, the TFT 91 for switching stores charge corresponding to a video signal (a signal including image information) in the storage capacitance 93. When unselected, the TFT 91 for switching has to retain the charge at all times. Therefore, charge leakage due to the OFF current value is required to be made as small as possible. In this sense, the most important task in designing the TFT 91 for switching is to decrease the OFF current value.

Next, the TFT 92 for current controlling is formed so as to have an active layer including a source-region 26, a drain region 27, and a channel forming region 29, a gate insulating film 18, a gate electrode 30, a first interlayer insulating film 20, a source wiring 31, and a drain wiring 32. It is to be noted that, though the gate electrode 30 forms a single-gate structure, it may form a double-gate structure.

The gate electrode 30 is electrically connected with the drain region 14 of the TFT 91 for switching through the drain wiring (which can also be called a connection wiring) 22. The source wiring 31 is integral with the connection wiring 25 to be connected with a common power supply line.

The TFT 92 for current controlling not only supplies electric current for making the EL element 94 emit light but also controls the amount of the supplied electric current to make gradation display possible.

As described in the above, the two TFTs structured differently according to their respective functions are disposed in a pixel. It is to be noted that, in the present embodiment, the TFT 91 for switching is an n-channel TFT while the TFT 92 for current controlling is a p-channel TFT. Though the TFT for current controlling is a p-channel TFT here, it may be formed of an n-channel TFT.

A passivation film 33 is a silicon nitride film or a silicon oxynitride film. A color filter 34 and a phosphor 35 (also referred to as a luminescent pigment layer) are the same color which is red (R), green (G), or blue (B), and include pigment of that color. The color filter 34 is provided for improving the color purity, and the phosphor 35 is provided for carrying out color conversion.

It is to be noted that color display methods of EL display devices are roughly divided into four: a method where three kinds of EL elements corresponding to RGB are formed; a method where EL elements which emit white light and color filters are combined; a method where EL elements which emit blue light and phosphors (luminescent color conversion measure: CCM) are combined; and a method where a transparent electrode used as the cathode (opposing electrode) and EL elements corresponding to RGB are combined.

The present embodiment is an example of the method where EL elements which emit blue light and phosphors are combined. Here, light having wavelength of the blue range including ultraviolet light is generated using a light emitting layer which emits blue light as the EL element 94, and the phosphor 35 is excited by that light to generate red, green, or blue light. The light is, after it passes through the color filter 34 to improve the color purity, outputted.

It is to be noted that the present embodiment can be implemented independent of the light emitting method, and all the four methods described in the above can be used in the present embodiment.

After the color filter 34 and the phosphor 35 are formed, a second interlayer insulating film 36 is formed to carry out flattening. As the second interlayer insulating film 36, an organic resin film made of, for example, polyimide, acryl resin, BCB (benzocyclobutene) is preferable, but of course, an inorganic resin film may also be used if enough flattening can be carried out.

A pixel electrode (an anode of the EL element) 37 made of a transparent conductive film is formed after a contact hole is formed in the second interlayer insulating film 36 and the passivation film 33 so as to be connected with the drain wiring 32 of the TFT 92 for current controlling.

An EL layer 38 (preferably made of an organic material), a cathode 39, and a protective electrode 40 are formed in this order on the pixel electrode 37. The EL layer 38 may have a single layer structure or a laminated structure, but often has a laminated structure. Various such laminated structures combining an electron transmitting layer, a positive hole transmitting layer, and the like with the light emitting layer have been proposed, and the present invention may have any such structures.

As the cathode 39, a material containing magnesium (Mg), lithium (Li), or calcium (Ca) having a small work function is used, and preferably, an MgAg electrode is used. The protective electrode 40 is an electrode provided for the purpose of protecting the cathode 39 against external moisture, and is formed of a material containing aluminum (Al) or silver (Ag).

It is to be noted that the EL layer 38 and the cathode 39 are preferably continuously formed without being exposed to the atmosphere. More specifically, no matter what kind of laminated structure the EL layer and the cathode may have, preferably, all of them are continuously formed. This is because, when an organic material is used as the EL layer, since such a material is easily affected by moisture, it is necessary to prevent the material from absorbing moisture due to its exposure to the atmosphere. Further, it is more preferable to continuously form not only the EL layer 38 and the cathode 39 but also the protective electrode 40.

The EL display device of the present embodiment has a pixel portion formed of pixels structured as described in the above, and TFTs structured differently according to their respective functions are disposed in a pixel. This makes it possible to form a TFT for switching which has a sufficiently low OFF current value and a TFT for current controlling which is not affected by hot carrier injection in the same pixel, and thus, an EL display device having high reliability and capable of displaying sufficient images can be formed.

The same thing can be said with regard to an active matrix EL display device where a driver circuit portion and a pixel portion are formed on the same substrate. In other words, the gist of the present invention is that TFTs structured differently according to their respective functions required by the circuit or the element are disposed both in the driver circuit portion and in the pixel portion.

It is to be noted that the EL display device of the present embodiment can be freely combined with any structure described in Embodiments 1 and 3–8.

[Embodiment 11]

It is possible to use a variety of liquid crystal materials in a liquid crystal display device manufactured in accordance with the present invention. The following can be given as examples of such materials: a TN liquid crystal; PDLC (polymer diffusion type liquid crystal); an FLC (ferro electric liquid crystal); an AFLC (antiferroelectric liquid crystal); and a mixture of an FLC and an AFLC.

For example, the liquid crystal materials disclosed in: Furue, H, et al., "Characteristics and Driving Scheme of Polymer-stabilized Monostable FLCD Exhibiting Fast Response Time and High Contrast Ratio with Gray-scale Capability," SID, 1998; in Yoshida, T., et al., "A Full-color Thresholdless Antiferroelectric LCD Exhibiting Wide Viewing Angle with Fast Response Time," SID 97 Digest, 841, 1997; S. Inui et al., "Thresholdless antiferroelectricity in liquid crystals and its application to displays, 671–673, J. Mater. Chem. 6(4), 1996; and in U.S. Pat. No. 5,594,569 can be used.

In particular, among an antiferroelectric liquid crystal material with no threshold value (thresholdless antiferroelectric LCD: abbreviated TL-AFLC) that shows electro-optical response characteristic in which transmittivity is continuously varied against electric field, is used, there are some that show V-shaped (or U-shaped) electro-optical response characteristic, and even liquid crystals whose operating voltage is approximately ±2.5 V are found. Accordingly there are some cases where power supply voltage for the pixel section is on the order of 5 to 8 V and that indicates a possibility of driving the driver circuit and the pixel circuit with the same power supply voltage. Namely, the entire liquid crystal display device can be made low power consumption.

Further, ferro electric liquid crystals and anti-ferro electric liquid crystals possess an advantage in that they have a high response time compared to TN liquid crystals. Since TFTs used in the present invention can achieve TFTs whose operation speed is very fast, it is possible to realize a liquid crystal display device having fast image response speed in which fast response speed of ferroeletric liquid crystal and antiferroelectric liquid crystal is sufficiently utilized.

Further, thresholdless antiferroelectric mixed liquid crystal has large spontaneous polarization in general, and the dielectric constant of liquid crystal itself is large. Therefore, comparatively large storage capacitor is required in the pixel in case of using thresholdless antiferroelectric mixed liquid crystal for a liquid crystal display device. It is preferable to use thresholdless antiferroelectric mixed liquid crystal having small spontaneous polarity. From this point of view, the storage capacitor shown in FIG. 4B of embodiment 1 is preferable because it can store a large capacitance in a small area.

It is needless to say that the use of liquid crystal display device of embodiment 11 for display of electronic devices such as personal computer etc. is effective.

The structure of the present invention can be freely combined with any structure of embodiment 1 to 9.

[Embodiment 12]

CMOS circuits and pixel section formed in accordance with the present invention can be used in various electro-optical devices (active matrix liquid crystal display device, active matrix EL display device and active matrix EC display device). Namely the present invention can be operated in all of the electronic machines (electronic device or electronic products) incorporating these electro-optical devices as a display.

The following can be given as examples of this type of electronic machines: liquid crystal displays; video cameras; digital still cameras; projectors (front type or rear type); goggle type displays (head mounted displays); car navigation systems; personal computers; portable information terminals (such as mobile computers, portable telephones or electronic book etc.); image reproduction devices having recording media (in concrete devices incorporating display which is capable of showing the image reproduced from recording medium such as compact disc (CD), laser disc (LD) or digital video disc (DVD)); etc. Some examples of these are shown in FIGS. 15A to 15F.

Figure 15A:
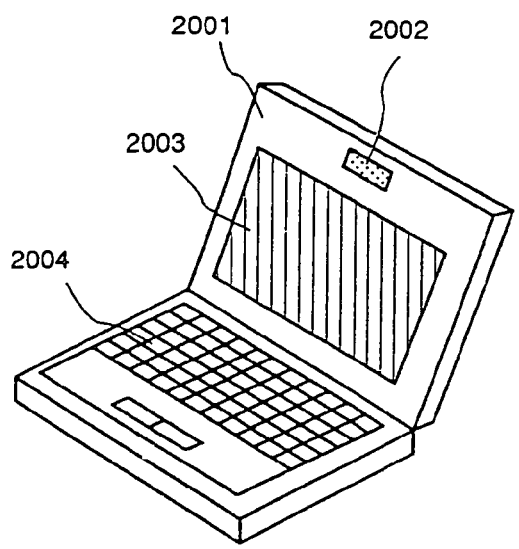
FIG. 15A–15F illustrates examples of electronic apparatus.

FIG. 15A is a personal computer, and comprises a main body 2001, an image receiving section 2002, a display device 2003, and a keyboard 2004 etc. The present invention can be applied to the display device 2003.

Figure 15B:
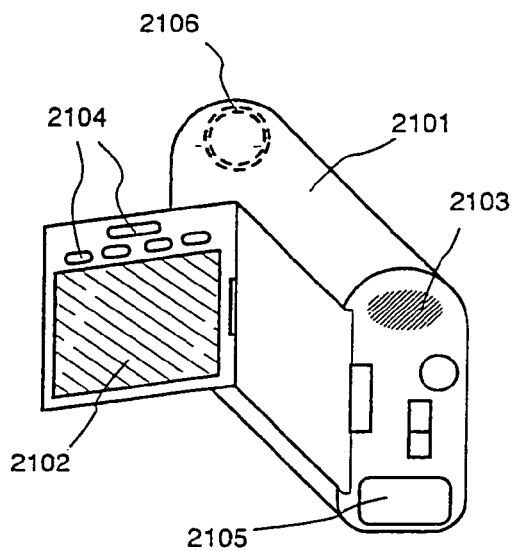

FIG. 15B is a video camera, and comprises a main body 2101, a display device 2102, a voice input section 2103, operation switches 2104, a battery 2105, and an image receiving section 2106. The present invention can be applied to the display device 2102.

Figure 15C:
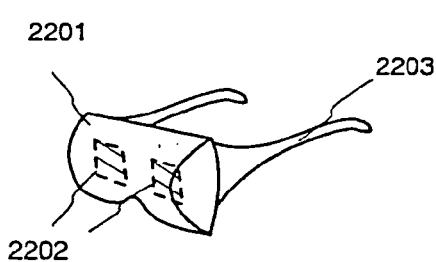

FIG. 15C is a goggle type display, and comprises a main body 2201, display device 2202, and arm sections 2203 etc. The present invention can be applied to the display device 2202.

Figure 15D:
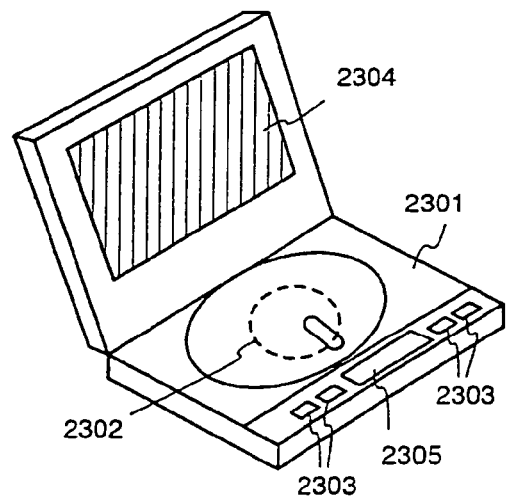

FIG. 15D is an image reproduction device (in concrete DVD reproduction device), and comprises: a main body 2301; a recording medium (CD, LD or DVD etc.) 2302; operation switches 2303; display device (a) 2304; and display device (b) 2305 etc. The display device (a) mainly displays image information and display device (b) mainly displays literal information, and the present invention can be used in these display devices (a) and (b). Note that the present invention can be used in CD reproduction devices, game machines as the image reproduction devices incorporating recording medium.

Figure 15E:
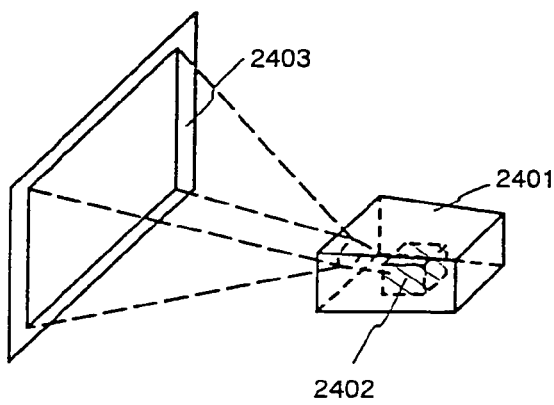

FIG. 15E is a front type projector, and comprises: a main body 2401 and an optical engine 2402 comprising a light source, optical lens and display device, etc, and it can display the image onto the screen 2403. The present invention can be used in the display device (not shown) incorporated in the optical engine 2402. Note that the display device may apply a system which used three plates or a system which uses a single plate, and further, it may be a transmissive type display device or a reflective type display device.

Figure 15F:
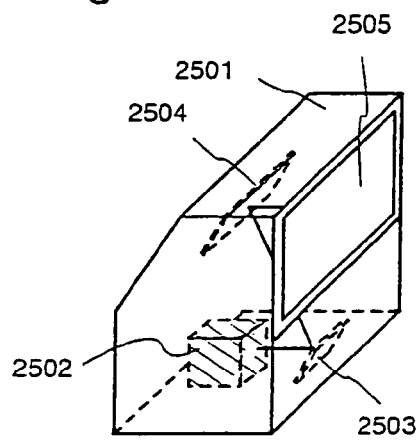

FIG. 15F is a rear type projector and comprises: a main body 2501; an optical engine 2402 comprising a light source, optical lens and display device, etc; reflectors 2503 and 2504; and screen 2505 etc. The present invention can be used in the display device (not shown) incorporated in the optical engine 2402. Note that the display device may apply a system which used three plates or a system which uses a single plate, and further, it may be a transmissive type display device or a reflective type display device.

As shown above, the applicable range of the present invention is very large, an it is possible to apply to electric machines of various area. Further, the electric machine of embodiment 12 can be realized by utilizing structures of any combination of embodiments 1 to 11.

[Embodiment 13]

In the present embodiment, an example of a method of forming electrodes and wirings illustrated in Embodiment 1, that is, a gate electrode having a tapered shape in section and a gate electrode, is described.

First, a gate insulating film made of silicon oxynitride is formed, and a metal laminated film is formed on the gate insulating film by sputtering. In the present embodiment, a tungsten target having the purity of 6N or more is used. As the sputtering gas, argon (Ar), krypton (Kr), xenon (Xe) or the like as a gas made of one chemical element or a mixture gas thereof is used. The film forming conditions such as the sputtering power, the gas pressure, and the substrate temperature are appropriately controlled by an operator. It is to be noted that the above-described metal laminated film has a tungsten nitride film expressed as WNx (0<x<1) as its lower portion and a tungsten film as its upper portion.

The metal laminated film obtained in this way contains almost no impurity element, and in particular, the oxygen content is 30 ppm or less. The electric resistivity can be made to be 20 $\mu\Omega$cm or less, typically 6–15 $\mu\Omega$cm. The stress of the film can be made to be from $-5\times10^9$ to $5\times10^9$ dyn/cm$^2$.

Next, a resist mask pattern (film thickness: 1.5 $\mu$m) for obtaining a desired gate wiring pattern is formed.

Then, in the present embodiment, an ICP (inductively coupled plasma) etching system using highly density plasma is used in etching and patterning the metal laminated film to form the gate electrode having a tapered shape in section and the gate electrode are formed.

Here, the plasma generating mechanism of the ICP dry etching system is described in detail with reference to FIG. 17.

Figure 17:
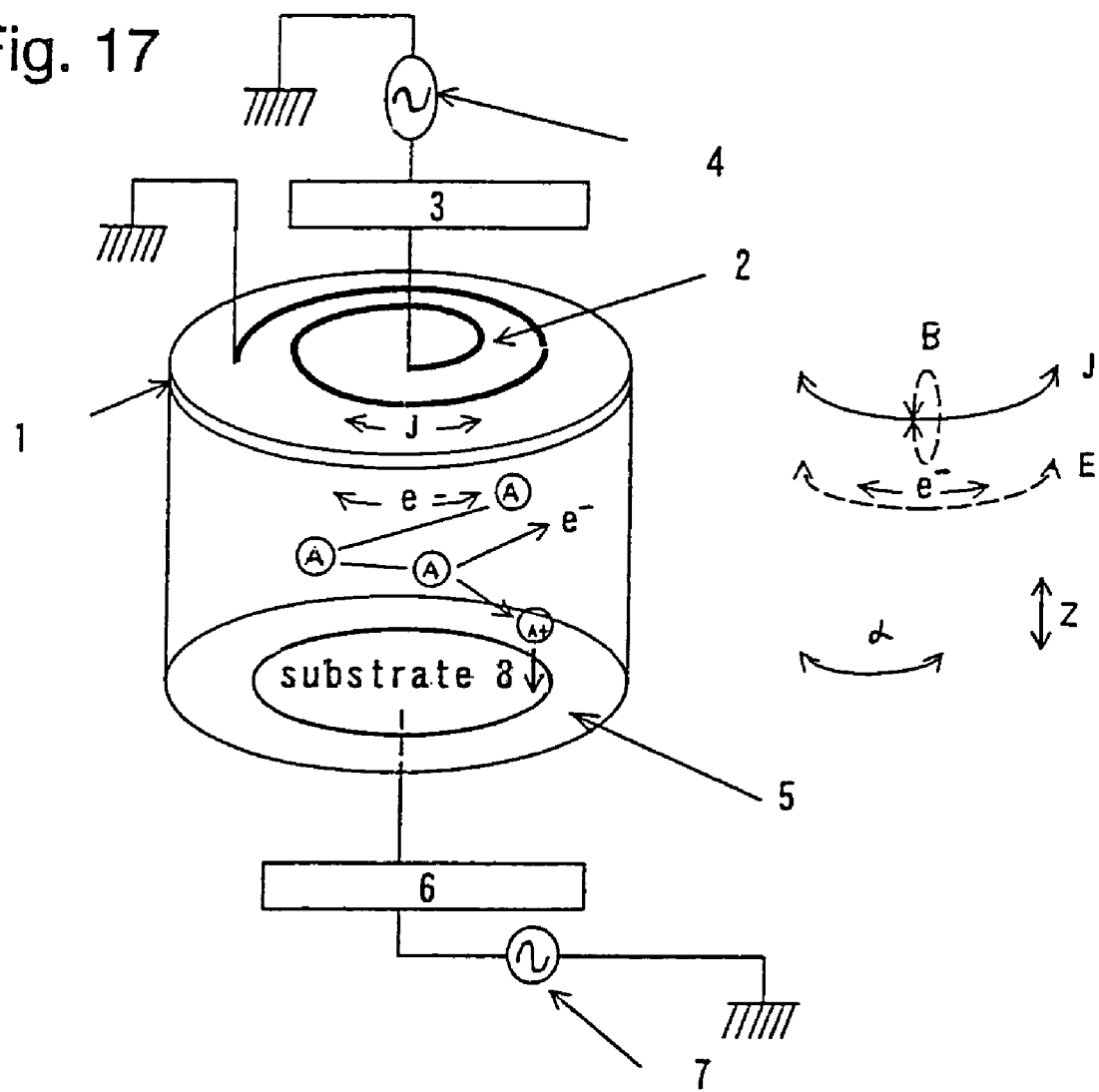
FIG. 17 illustrates a plasma generating mechanism of an ICP etching system.

FIG. 17 is a schematic structural view of an etching chamber. An antenna coil 2 disposed on a quartz plate 1 at the top of the chamber is connected with an RF power source 4 through a matching box 3. An opposingly disposed lower electrode 5 on the substrate side is connected with an RF power source 7 through a matching box 6.

When RF current is applied to the antenna coil 2 above the substrate, RF current J passes through the antenna coil 2 in directions denoted as α, and magnetic field B is generated in directions denoted as Z.

$\mu_0 J = \text{rot } B$

According to Faraday's law of electromagnetic induction, an induction field E is generated in the directions denoted as α.

$-\partial B/\partial t = \text{rot } E$

In the induction field E, electrons are accelerated in the directions denoted as α and collide against the gas molecules to generate plasma. Since the directions of the induction field is α, the probability that charged particles collide against walls of the etching chamber or the substrate to lose the charge is low. Accordingly, highly density plasma can be generated with pressure as low as about 1 Pa. Since there is almost no downstream magnetic field B, the region of the highly density plasma extends like a sheet.

By adjusting the RF power to be applied to the antenna coil 2 (to which the ICP power is applied) and to the lower electrode 5 on the substrate side (to which the bias power is applied), respectively, the plasma density and the self bias voltage can be independently controlled. Further, the frequency of the applied RF power can be varied according to the film to be etched.

Figure 18:
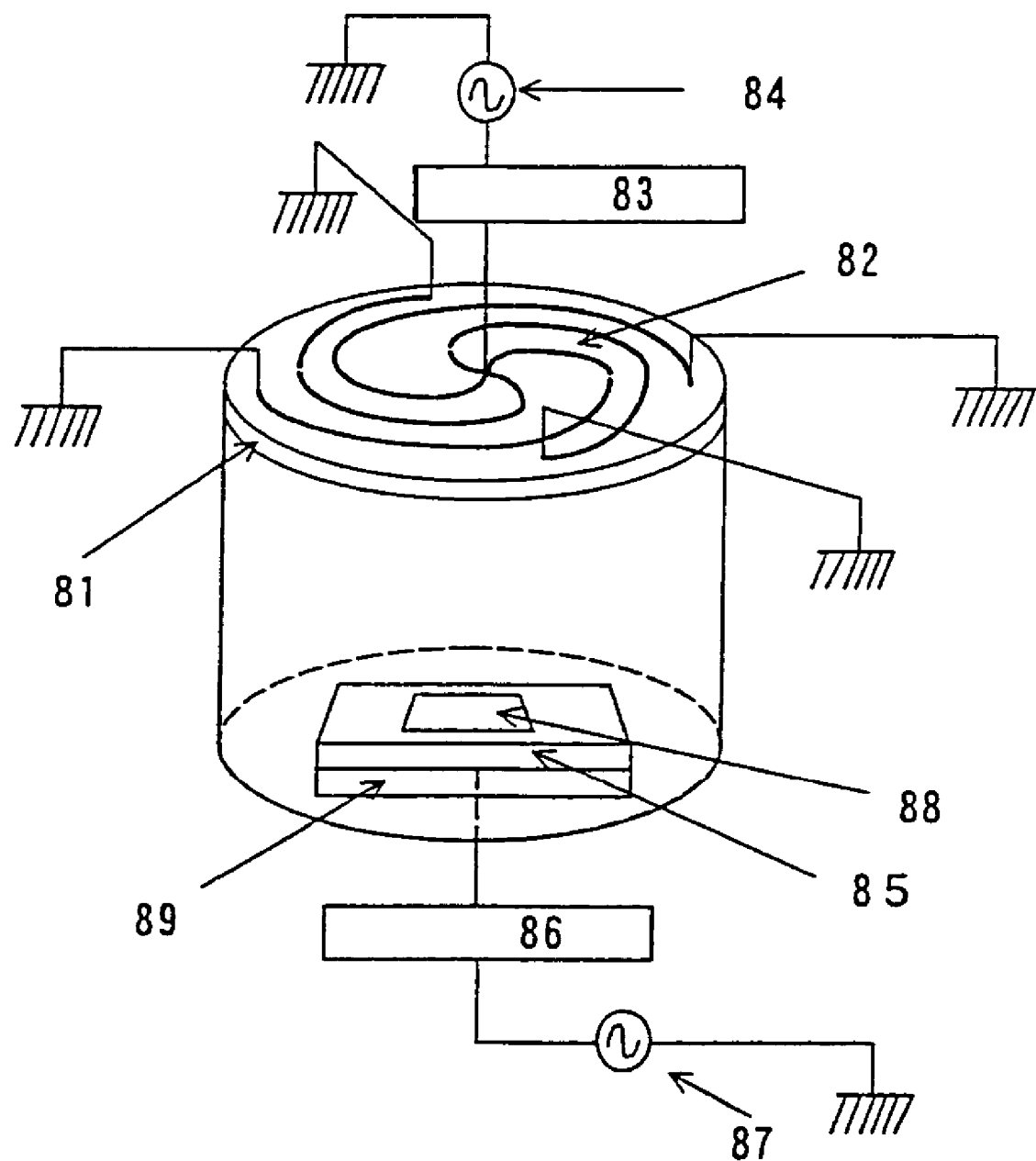
FIG. 18 illustrates an ICP etching system using multispiral coils.

In order to obtain highly density plasma in an ICP etching system, it is necessary to pass the RF current J through the antenna coil 2 with small loss. In order to make larger the area of the display device, it is necessary to lower the inductance of the antenna coil 2. For the purpose of attaining these, an ICP etching system with the antenna divided, that is, with multispiral coils 82, as illustrated in FIG. 18, has been developed. A reference numeral 81 denotes a quartz plate. Reference numerals 83 and 86 denote matching boxes, and reference numerals 84 and 87 denote RF power sources. A lower electrode 85 for retaining a substrate 88 is provided at the bottom of the chamber through an insulator 89.

In the present embodiment, by using the ICP etching system using multispiral coils among various ICP etching systems, wirings having the desired taper angle θ are formed.

Figure 19:
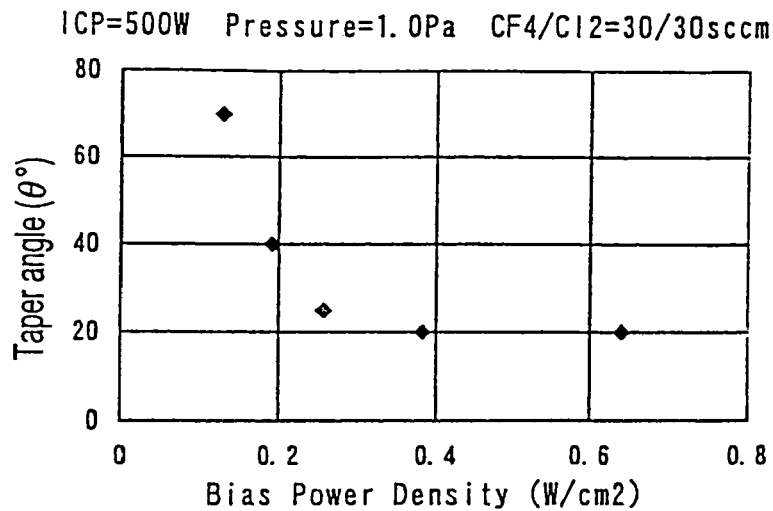
FIG. 19 is a graph showing the dependence of the taper angle $\theta$ on the bias power density.

In order to obtain the desired taper angle θ, in the present embodiment, the bias power density of the ICP etching system is adjusted. FIG. 19 is a graph showing the dependence of the taper angle θ on the bias power density. As shown in FIG. 19, the taper angle θ can be controlled by controlling the bias power density.

Figure 20:
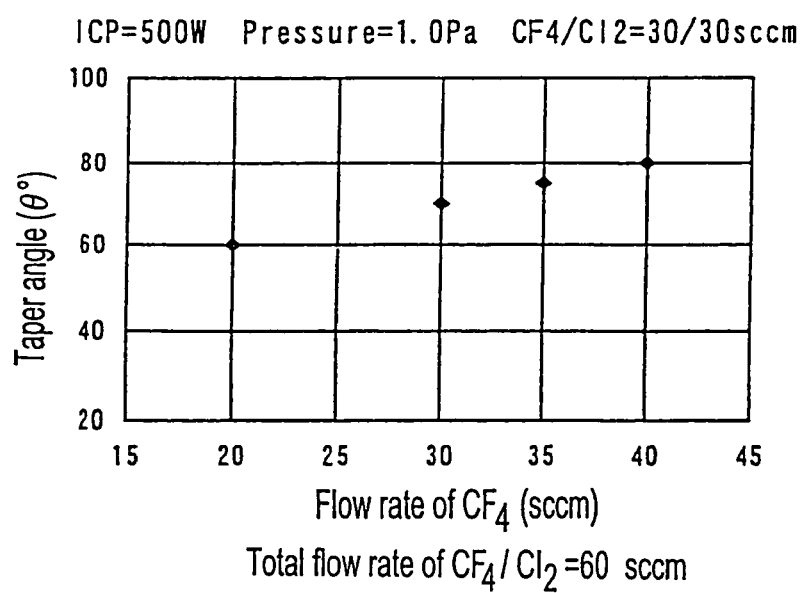
FIG. 20 is a graph showing the dependence of the taper angle $\theta$ on the flow rate ratio of $CF_4$.

Alternatively, the flow rate ratio of CF$_4$ in the etching gas (mixture gas of CF$_4$ and Cl$_2$) may be adjusted. FIG. 20 is a graph showing the dependence of the taper angle θ on the flow rate ratio of CF$_4$. By making larger the flow rate ratio of CF$_4$, the selection ratio of tungsten to the resist is made larger, and thus, the taper angle θ of the wirings can be made larger.

Figure 21:
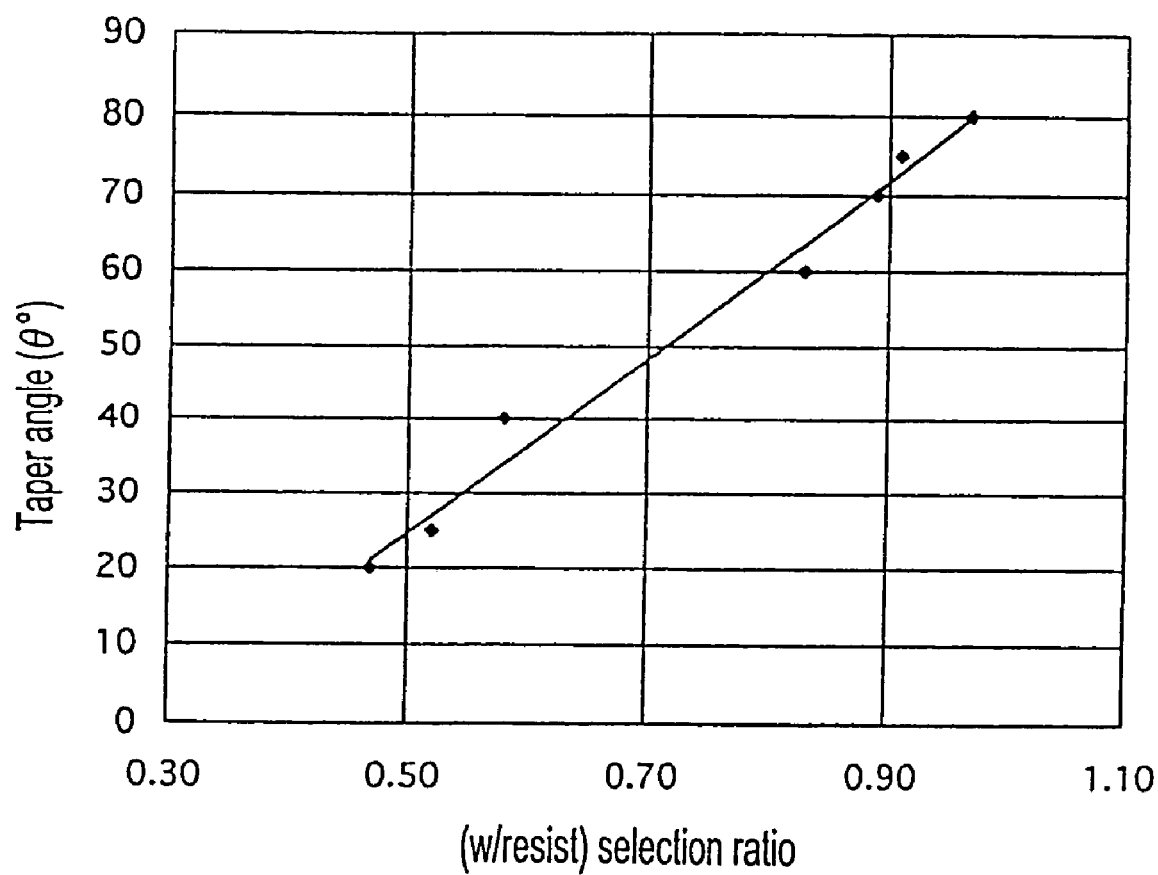
FIG. 21 is a graph showing the dependence of the taper angle $\theta$ on the (W/resist) selection ratio.

Further, the taper angle θ is thought to depend on the selection ratio of tungsten to the resist. FIG. 21 is a graph showing the dependence of the taper angle θ on the selection ratio of tungsten to the resist.

In this way, by appropriately determining the bias power density or the reaction gas flow rate ratio using the ICP etching system, the gate electrodes and wirings having the desired taper angle θ=3–40° (preferably 5–35°, and more preferably 7–20°) can be formed-very easily.

Though a tungsten film is described as an example, by using an ICP etching system with regard to known heat resisting conductive materials (Ta, Ti, Mo, Cr, Nb, Si, and the like), end portions of the pattern can be easily processed to have a tapered shape.

Further, though mixture gas of CF$_4$ (carbon tetrafluoride) and Cl$_2$ is used as the etching gas used for the above-described dry etching, the present invention is not limited thereto, and, for example, mixture gas of a reactive gas containing fluorine and selected between C$_2$F$_6$ and C$_4$F$_8$ and a gas containing chlorine and selected among Cl$_2$, SiCl$_4$, and BCl$_3$ may also be used.

By carrying out the remaining processes according to Embodiment 1, a semiconductor device is completed.

It is to be noted that the structure of the present embodiment can be freely combined with any structure described in Embodiments 1–12.

By using the present invention, TFTs structured appropriately according to their respective performance required by the circuit or the element can be disposed on the same substrate, which can greatly improve the operating performance and the reliability of the semiconductor device.

Further, in addition to the structures described in the above, in an LDD region of an n-channel TFT used in the present invention, a region having a concentration gradient exists where the concentration of an n-type impurity element becomes higher as the distance from an adjoining drain region decreases. Such a region having a concentration gradient is expected to further enhance the effect of alleviating the electric field.

This follows that improvement can be attained of the operating performance and the reliability of electric apparatus having such an electro-optical device as a display medium.

What is claimed is:

1. A method of manufacturing a semiconductor device comprising:
    forming a crystalline semiconductor layer over an insulating substrate;
    forming a gate insulating film on the crystalline semiconductor layer;
    forming a conductive film on the gate insulating film; and
    etching the conductive film so as to form a gate electrode having a tapered cross section by using an inductively coupled plasma chamber having multispiral coils.

2. A method of manufacturing a semiconductor device according to claim 1, wherein the gate electrode comprises at least one selected from the group consisting of tantalum, chromium, tungsten, and silicon having conductivity.

3. A method of manufacturing a semiconductor device according to claim 1, wherein a taper angle of the gate electrode is between 3 and 40°.

4. A method of manufacturing a semiconductor device according to claim 1, wherein the step of etching the conductive film is conducted in a mixture gas containing fluorine and chlorine.

5. A method of manufacturing a semiconductor device according to claim 4, wherein the gas containing fluorine is one selected from the group consisting of $CF_4$, $C_2F_6$ and $C_4F_8$.

6. A method of manufacturing a semiconductor device according to claim 4, wherein the gas containing chlorine is one selected from the group consisting of $Cl_2$, $SiCl_4$, and $BCl_3$.

7. A method of manufacturing a semiconductor device according to claim 1, wherein the semiconductor device is at least one of a liquid crystal display device and an EL display device.

8. A method of manufacturing a semiconductor device according to claim 1, wherein the semiconductor device is at least one selected from the group consisting of a personal computer, a video camera, a goggle type display, an image reproduction device, and a projector.

9. A method of manufacturing a semiconductor device comprising:
    forming a crystalline semiconductor layer over an insulating substrate;
    forming a gate insulating film on the crystalline semiconductor layer;
    forming a conductive film on the gate insulating film; and
    etching the conductive film so as to form a gate electrode having a tapered cross section by using an inductively coupled plasma chamber after determining a flow rate ratio of an etching gas.

10. A method of manufacturing a semiconductor device according to claim 9, wherein the gate electrode comprises at least one selected from the group consisting of tantalum, chromium, tungsten, and silicon having conductivity.

11. A method of manufacturing a semiconductor device according to claim 9, wherein a taper angle of the gate electrode is between 3 and 40°.

12. A method of manufacturing a semiconductor device according to claim 9, wherein the etching gas is a mixture gas containing fluorine and chlorine.

13. A method of manufacturing a semiconductor device according to claim 12, wherein the gas containing fluorine is one selected from the group consisting of $CF_4$, $C_2F_6$ and $C_4F_8$.

14. A method of manufacturing a semiconductor device according to claim 12, wherein the gas containing chlorine is one selected from the group consisting of $Cl_2$, $SiCl_4$, and $BCl_3$.

15. A method of manufacturing a semiconductor device according to claim 9, wherein the semiconductor device is at least one of a liquid crystal display device and an EL display device.

16. A method of manufacturing a semiconductor device according to claim 9, wherein the semiconductor device is at least one selected from the group consisting of a personal computer, a video camera, a goggle type display, an image reproduction device, and a projector.

17. A method of manufacturing a semiconductor device comprising:
    forming a crystalline semiconductor layer over an insulating substrate;
    forming a gate insulating film on the crystalline semiconductor layer;
    forming a conductive film on the gate insulating film; and
    etching the conductive film so as to form a gate electrode having a tapered cross section by using an inductively coupled plasma chamber after determining a bias power density.

18. A method of manufacturing a semiconductor device according to claim 17, wherein the gate electrode comprises at least one selected from the group consisting of tantalum, chromium, tungsten, and silicon having conductivity.

19. A method of manufacturing a semiconductor device according to claim 17, wherein a taper angle of the gate electrode is between 3 and 40°.

20. A method of manufacturing a semiconductor device according to claim 17, wherein the step of etching the conductive film is conducted in a mixture gas containing fluorine and chlorine.

21. A method of manufacturing a semiconductor device according to claim 20, wherein the gas containing fluorine is one selected from the group consisting of $CF_4$, $C_2F_6$ and $C_4F_8$.

22. A method of manufacturing a semiconductor device according to claim 20, wherein the gas containing chlorine is one selected from the group consisting of $Cl_2$, $SiCl_4$, and $BCl_3$.

23. A method of manufacturing a semiconductor device according to claim 17, wherein the semiconductor device is at least one of a liquid crystal display device and an EL display device.

24. A method of manufacturing a semiconductor device according to claim 17, wherein the semiconductor device is at least one selected from the group consisting of a personal computer, a video camera, a goggle type display, an image reproduction device, and a projector.

25. A method of manufacturing a semiconductor device comprising:
    forming a crystalline semiconductor layer over an insulating substrate;

forming a gate insulating film on the crystalline semiconductor layer;

forming a conductive film on the gate insulating film; and etching the conductive film so as to form a gate electrode having a tapered cross section by using an inductively coupled plasma chamber having multispiral coils after determining a flow rate ratio of an etching gas.

26. A method of manufacturing a semiconductor device according to claim 25, wherein the gate electrode comprises at least one selected from the group consisting of tantalum, chromium, tungsten, and silicon having conductivity.

27. A method of manufacturing a semiconductor device according to claim 25, wherein a taper angle of the gate electrode is between 3 and 40°.

28. A method of manufacturing a semiconductor device according to claim 25, wherein the etching gas is a mixture gas containing fluorine and chlorine.

29. A method of manufacturing a semiconductor device according to claim 28, wherein the gas containing fluorine is one selected from the group consisting of $CF_4$, $C_2F_6$ and $C_4F_8$.

30. A method of manufacturing a semiconductor device according to claim 28, wherein the gas containing chlorine is one selected from the group consisting of $Cl_2$, $SiCl_4$, and $BCl_3$.

31. A method of manufacturing a semiconductor device according to claim 25, wherein the semiconductor device is at least one of a liquid crystal display device and an EL display device.

32. A method of manufacturing a semiconductor device according to claim 25, wherein the semiconductor device is at least one selected from the group consisting of a personal computer, a video camera, a goggle type display, an image reproduction device, and a projector.

33. A method of manufacturing a semiconductor device comprising:

forming a crystalline semiconductor layer over an insulating substrate;

forming a gate insulating film on the crystalline semiconductor layer;

forming a conductive film on the gate insulating film; and etching the conductive film so as to form a gate electrode having a tapered cross section by using an inductively coupled plasma chamber having multispiral coils after determining a bias power density.

34. A method of manufacturing a semiconductor device according to claim 33, wherein the gate electrode comprises at least one selected from the group consisting of tantalum, chromium, tungsten, and silicon having conductivity.

35. A method of manufacturing a semiconductor device according to claim 33, wherein a taper angle of the gate electrode is between 3 and 40°.

36. A method of manufacturing a semiconductor device according to claim 33, wherein the step of etching the conductive film is conducted in a mixture gas containing fluorine and chlorine.

37. A method of manufacturing a semiconductor device according to claim 36, wherein the gas containing fluorine is one selected from the group consisting of $CF_4$, $C_2F_6$ and $C_4F_8$.

38. A method of manufacturing a semiconductor device according to claim 36, wherein the gas containing chlorine is one selected from the group consisting of $Cl_2$, $SiCl_4$, and $BCl_3$.

39. A method of manufacturing a semiconductor device according to claim 33, wherein the semiconductor device is at least one of a liquid crystal display device and an EL display device.

40. A method of manufacturing a semiconductor device according to claim 33, wherein the semiconductor device is at least one selected from the group consisting of a personal computer, a video camera, a goggle type display, an image reproduction device, and a projector.

41. A method of manufacturing a semiconductor device according to claim 1, wherein the gate electrode has a top surface, a side surface, and a bottom surface which is in contact with the gate insulating film, and wherein the bottom surface is larger than the top surface.

42. A method of manufacturing a semiconductor device according to claim 9, wherein the gate electrode has a top surface, a side surface, and a bottom surface which is in contact with the gate insulating film, and wherein the bottom surface is larger than the top surface.

43. A method of manufacturing a semiconductor device according to claim 17, wherein the gate electrode has a top surface, a side surface, and a bottom surface which is in contact with the gate insulating film, and wherein the bottom surface is larger than the top surface.

44. A method of manufacturing a semiconductor device according to claim 25, wherein the gate electrode has a top surface, a side surface, and a bottom surface which is in contact with the gate insulating film, and wherein the bottom surface is larger than the top surface.

45. A method of manufacturing a semiconductor device according to claim 33, wherein the gate electrode has a top surface, a side surface, and a bottom surface which is in contact with the gate insulating film, and wherein the bottom surface is larger than the top surface.

46. A method of manufacturing a semiconductor device comprising:

forming a crystalline semiconductor layer over an insulating substrate;

forming a gate insulating film on the crystalline semiconductor layer;

forming a conductive film on the gate insulating film; and etching the conductive film so as to form a gate electrode having a tapered cross section by using an inductively coupled plasma chamber.

47. A method of manufacturing a semiconductor device according to claim 46, wherein the gate electrode has a top surface, a side surface, and a bottom surface which is in contact with the gate insulating film, and wherein the bottom surface is larger than the top surface.

48. A method of manufacturing a semiconductor device according to claim 46, wherein the gate electrode comprises at least one selected from the group consisting of tantalum, chromium, tungsten, and silicon having conductivity.

49. A method of manufacturing a semiconductor device according to claim 46, wherein a taper angle of the gate electrode is between 3 and 40°.

50. A method of manufacturing a semiconductor device according to claim 46, wherein the step of etching the conductive film is conducted in a mixture gas containing fluorine and chlorine.

51. A method of manufacturing a semiconductor device according to claim 50, wherein the gas containing fluorine is one selected from the group consisting of $CF_4$, $C_2F_6$ and $C_4F_8$.

52. A method of manufacturing a semiconductor device according to claim 50, wherein the gas containing chlorine is one selected from the group consisting of $Cl_2$, $SiCl_4$, and $BCl_3$.

53. A method of manufacturing a semiconductor device according to claim 46, wherein the semiconductor device is at least one of a liquid crystal display device and an EL display device.

54. A method of manufacturing a semiconductor device according to claim 46, wherein the semiconductor device is at least one selected from the group consisting of a personal computer, a video camera, a goggle type display, an image reproduction device, and a projector.

* * * * *